US011113887B2

(12) United States Patent
Kopeinigg et al.

(10) Patent No.: US 11,113,887 B2
(45) Date of Patent: Sep. 7, 2021

(54) GENERATING THREE-DIMENSIONAL CONTENT FROM TWO-DIMENSIONAL IMAGES

(71) Applicant: VERIZON PATENT AND LICENSING INC., Basking Ridge, NJ (US)

(72) Inventors: Daniel Kopeinigg, Palo Alto, CA (US); Arthur van Hoff, San Mateo, CA (US); Philip Lee, San Mateo, CA (US); Solmaz Hajmohammadi, San Mateo, CA (US); Sourabh Khire, San Mateo, CA (US); Simion Venshtain, San Mateo, CA (US); Andrew Walkingshaw, San Mateo, CA (US)

(73) Assignee: Verizon Patent and Licensing Inc, Basking Ridge, NJ (US)

( * ) Notice: Subject to any disclaimer, the term of this patent is extended or adjusted under 35 U.S.C. 154(b) by 0 days.

(21) Appl. No.: 16/428,982

(22) Filed: Jun. 1, 2019

(65) Prior Publication Data
US 2019/0287310 A1    Sep. 19, 2019

Related U.S. Application Data

(63) Continuation-in-part of application No. 16/241,991, filed on Jan. 8, 2019, now abandoned.
(Continued)

(51) Int. Cl.
*G06T 19/00*    (2011.01)
*G06N 3/04*    (2006.01)
(Continued)

(52) U.S. Cl.
CPC ............ *G06T 19/006* (2013.01); *G06F 30/20* (2020.01); *G06K 9/6267* (2013.01);
(Continued)

(58) Field of Classification Search
CPC ......... G06T 19/006; G06T 7/70; G06N 20/00; G06N 3/0454; G06F 30/20; G06K 9/6267; G06Q 50/01
See application file for complete search history.

(56) References Cited

U.S. PATENT DOCUMENTS 5,714,997 A  *  2/1998  Anderson  ............ G02B 27/017
                                                    348/39
5,729,471 A  *  3/1998  Jain  ...................... H04N 13/117
                                                    725/131
(Continued)

*Primary Examiner* — Charles L Beard

(57) ABSTRACT

A method includes receiving two-dimensional video streams from a plurality of cameras, the two-dimensional video streams including multiple angles of a sporting event. The method further includes determining boundaries of the sporting event from the two-dimensional video streams. The method further includes identifying a location of a sporting object during the sporting event. The method further includes identifying one or more players in the sporting event. The method further includes identifying poses of each of the one or more players during the sporting event. The method further includes generating a three-dimensional model of the sporting event based on the boundaries of the sporting event, the location of the sporting object during the sporting event, and the poses of each of the one or more players during the sporting event. The method further includes generating a simulation of the three-dimensional model.

19 Claims, 8 Drawing Sheets

Related U.S. Application Data

(60) Provisional application No. 62/614,899, filed on Jan. 8, 2018.

(51) Int. Cl.
*G06N 20/00* (2019.01)
*G06Q 50/00* (2012.01)
*G06T 7/70* (2017.01)
*G06K 9/62* (2006.01)
*G06F 30/20* (2020.01)

(52) U.S. Cl.
CPC ........... *G06N 3/0454* (2013.01); *G06N 20/00* (2019.01); *G06Q 50/01* (2013.01); *G06T 7/70* (2017.01)

(56) References Cited

U.S. PATENT DOCUMENTS

| | | | | |
|---|---|---|---|---|
| 6,111,582 | A * | 8/2000 | Jenkins | G06T 15/40 345/421 |
| 6,532,015 | B1 * | 3/2003 | Hayashi | A63F 13/10 345/474 |
| 6,806,893 | B1 * | 10/2004 | Kolawa | G06F 3/04817 715/836 |
| 6,983,419 | B1 * | 1/2006 | Yonezawa | G08B 13/19641 715/722 |
| 7,193,645 | B1 * | 3/2007 | Aagaard | H04N 5/222 348/211.3 |
| 7,522,186 | B2 * | 4/2009 | Arpa | G06T 15/205 348/143 |
| 7,532,215 | B2 * | 5/2009 | Yoda | G06T 15/30 345/424 |
| 7,561,160 | B2 * | 7/2009 | Fukuya | G06T 19/00 345/474 |
| 7,724,250 | B2 * | 5/2010 | Ishii | G06F 3/011 345/419 |
| 7,782,363 | B2 * | 8/2010 | Ortiz | H04N 7/18 348/211.8 |
| 7,796,155 | B1 * | 9/2010 | Neely, III | G06T 19/006 348/157 |
| 7,823,066 | B1 * | 10/2010 | Kuramura | G06Q 30/00 715/717 |
| 8,016,653 | B2 * | 9/2011 | Pendleton | A63F 13/803 463/6 |
| 8,087,054 | B2 * | 12/2011 | Zacks | G06F 16/739 725/86 |
| 8,114,172 | B2 * | 2/2012 | Givon | G06K 9/3216 48/49 |
| 8,174,572 | B2 * | 5/2012 | Buehler | G08B 13/19693 348/143 |
| 8,300,894 | B2 * | 10/2012 | Chien | G06K 9/00765 382/107 |
| 8,355,083 | B2 * | 1/2013 | Keiser | H04N 5/2224 348/559 |
| 8,355,532 | B2 * | 1/2013 | Gillard | G06T 17/00 382/103 |
| 8,363,980 | B2 * | 1/2013 | Beresford | G06T 7/80 382/293 |
| 8,368,721 | B2 * | 2/2013 | McCoy | A63F 13/213 345/633 |
| 8,452,052 | B2 * | 5/2013 | Erignac | G06T 7/292 382/104 |
| 8,462,198 | B2 * | 6/2013 | Lin | G06T 13/40 348/43 |
| 8,484,564 | B1 * | 7/2013 | Marti | G06Q 50/01 463/42 |
| 8,497,838 | B2 * | 7/2013 | Langridge | G06F 3/017 345/157 |
| 8,509,545 | B2 * | 8/2013 | Dedhia | G06K 9/3241 382/103 |
| 8,526,734 | B2 * | 9/2013 | Al-Ghosien | G06T 7/251 382/173 |
| 8,527,340 | B2 * | 9/2013 | Fisher | G06Q 30/02 705/14.4 |
| 8,537,157 | B2 * | 9/2013 | Adimatyam | G06F 3/0481 345/420 |
| 8,631,355 | B2 * | 1/2014 | Murillo | G06F 3/017 715/863 |
| 8,648,857 | B2 * | 2/2014 | Williams | G06T 15/20 345/427 |
| 8,675,073 | B2 * | 3/2014 | Aagaard | H04N 17/002 348/157 |
| 8,744,121 | B2 * | 6/2014 | Polzin | G06K 9/00342 382/103 |
| 8,761,437 | B2 * | 6/2014 | Kirovski | A63F 13/42 382/103 |
| 8,786,680 | B2 * | 7/2014 | Shiratori | G06F 3/011 345/156 |
| 8,824,749 | B2 * | 9/2014 | Leyvand | G06K 9/00221 382/100 |
| 8,827,799 | B1 * | 9/2014 | Brown | A63F 13/792 463/25 |
| 8,920,241 | B2 * | 12/2014 | Reville | G06F 3/017 345/156 |
| 8,994,718 | B2 * | 3/2015 | Latta | G06F 3/005 345/419 |
| 9,008,355 | B2 * | 4/2015 | Markovic | G01S 3/786 382/103 |
| 9,013,489 | B2 * | 4/2015 | Everitt | G06T 19/20 345/473 |
| 9,059,809 | B2 * | 6/2015 | Koehler | H04L 65/4038 |
| 9,117,310 | B2 * | 8/2015 | Coene | G06T 15/205 |
| 9,129,077 | B2 * | 9/2015 | Raschke | G06F 30/20 |
| 9,149,309 | B2 * | 10/2015 | Paczkowski | G06K 9/00671 |
| 9,152,228 | B2 * | 10/2015 | Rekimoto | G06F 3/002 |
| 9,153,195 | B2 * | 10/2015 | Geisner | G09G 5/00 |
| 9,182,814 | B2 * | 11/2015 | Kipman | G06K 9/00369 |
| 9,183,676 | B2 * | 11/2015 | McCulloch | G06T 19/006 |
| 9,266,017 | B1 * | 2/2016 | Parker | A63F 13/355 |
| 9,268,406 | B2 * | 2/2016 | Geisner | G02B 27/017 |
| 9,288,545 | B2 * | 3/2016 | Hill | H04N 21/8126 |
| 9,345,957 | B2 * | 5/2016 | Geisner | G06T 19/006 |
| 9,349,042 | B2 * | 5/2016 | Takenaka | G06K 9/00369 |
| 9,350,969 | B2 * | 5/2016 | Cohen | H04N 13/106 |
| 9,361,660 | B2 * | 6/2016 | Tanaka | G06F 3/04815 |
| 9,384,329 | B2 * | 7/2016 | Wilson | G06F 19/3475 |
| 9,386,282 | B2 * | 7/2016 | Hazzani | G08B 13/19608 |
| 9,406,131 | B2 * | 8/2016 | Wurmlin | G06T 7/85 |
| 9,479,768 | B2 * | 10/2016 | Yukich | H04N 5/247 |
| 9,510,051 | B1 * | 11/2016 | Bostick | H04N 21/4668 |
| 9,532,112 | B2 * | 12/2016 | Chu | H04N 7/165 |
| 9,573,062 | B1 * | 2/2017 | Long | A63F 13/00 |
| 9,600,760 | B2 * | 3/2017 | Essa | G06N 3/006 |
| 9,609,373 | B2 * | 3/2017 | Rango | H04N 21/2187 |
| 9,654,844 | B2 * | 5/2017 | Kim | H04N 21/26603 |
| 9,674,435 | B1 * | 6/2017 | Monari | H04N 13/243 |
| 9,693,108 | B2 * | 6/2017 | Yang | H04N 21/2187 |
| 9,709,806 | B2 * | 7/2017 | Ishikawa | G09G 3/003 |
| 9,767,613 | B1 * | 9/2017 | Bedikian | G06F 3/04845 |
| 9,846,961 | B2 * | 12/2017 | Haimovitch-Yogev | G06T 11/003 |
| 9,848,106 | B2 * | 12/2017 | Scavezze | H04N 5/225 |
| 9,894,323 | B2 * | 2/2018 | Narasimhan | H04N 21/4722 |
| 9,999,825 | B2 * | 6/2018 | Shachar | A63B 71/02 |
| 10,102,659 | B1 * | 10/2018 | Hariton | G06F 3/011 |
| 10,105,601 | B1 * | 10/2018 | Hariton | G06T 15/20 |
| 10,121,061 | B2 * | 11/2018 | Dickinson | H04N 21/8153 |
| 10,186,086 | B2 * | 1/2019 | Giraldi | G06F 3/04842 |
| 10,198,843 | B2 * | 2/2019 | Short | G06T 19/20 |
| 10,235,809 | B2 * | 3/2019 | Evans | G06Q 90/00 |
| 10,248,847 | B2 * | 4/2019 | Cambor | G06K 9/00288 |
| 10,250,838 | B1 * | 4/2019 | Herz | H04N 21/4316 |
| 10,255,677 | B2 * | 4/2019 | Hall | G06K 9/00342 |
| 10,264,211 | B2 * | 4/2019 | Leech | H04N 19/115 |
| 10,269,181 | B2 * | 4/2019 | Lodato | H04N 13/282 |
| 10,271,043 | B2 * | 4/2019 | Champion | G06F 3/0482 |
| 10,281,979 | B2 * | 5/2019 | Oyama | G06K 9/3233 |
| 10,297,087 | B2 * | 5/2019 | Gervasio | G06T 19/006 |
| 10,321,117 | B2 * | 6/2019 | Koch | H04N 13/243 |
| 10,341,537 | B2 * | 7/2019 | Sarkar | H04N 5/272 |

(56) References Cited

U.S. PATENT DOCUMENTS

| | | | |
|---|---|---|---|
| 10,360,713 B1* | 7/2019 | Arana | G06T 11/60 |
| 10,372,752 B1* | 8/2019 | Veitch | G06Q 30/0267 |
| 10,375,287 B2* | 8/2019 | Gefen | H04N 5/232 |
| 10,395,549 B2* | 8/2019 | Beck | G09B 9/02 |
| 10,419,788 B2* | 9/2019 | Arimilli | H04N 21/816 |
| 10,471,360 B2* | 11/2019 | Trombetta | H04L 65/4076 |
| 10,482,677 B1* | 11/2019 | Iyer | G06F 3/04815 |
| 10,491,863 B2* | 11/2019 | Yoneji | G06T 7/292 |
| 10,491,943 B1* | 11/2019 | Wahlquist-Ortiz | A63F 13/46 |
| 10,500,479 B1* | 12/2019 | Malik | A63F 13/00 |
| 10,522,116 B2* | 12/2019 | Wei | G06F 3/011 |
| 10,554,921 B1* | 2/2020 | Lim | G06T 7/70 |
| 10,561,943 B2* | 2/2020 | Barber | A63F 13/52 |
| 10,586,396 B1* | 3/2020 | Hariton | G06F 3/011 |
| 10,592,064 B2* | 3/2020 | Ames | G06F 3/04815 |
| 10,649,613 B2* | 5/2020 | Hutten | H04N 21/23424 |
| 10,650,590 B1* | 5/2020 | Topiwala | G06F 3/011 |
| 10,656,720 B1* | 5/2020 | Holz | G06F 3/017 |
| 10,659,698 B2* | 5/2020 | Bhuruth | G06Q 30/02 |
| 10,659,822 B2* | 5/2020 | Onuma | H04N 21/26241 |
| 10,665,027 B2* | 5/2020 | Leppanen | G06F 3/011 |
| 10,666,924 B2* | 5/2020 | Matsushita | G06T 7/97 |
| 10,699,473 B2* | 6/2020 | Shikata | G06T 7/194 |
| 10,700,944 B2* | 6/2020 | Hutten | H04L 41/50 |
| 10,706,634 B1* | 7/2020 | Baumbach | H04W 4/40 |
| 10,728,528 B2* | 7/2020 | Haimovitch-Yogev | G06T 7/11 |
| 10,755,471 B2* | 8/2020 | Umemura | G06T 15/20 |
| 10,765,957 B2* | 9/2020 | Trombetta | H04N 21/21805 |
| 10,795,560 B2* | 10/2020 | Branch | H04L 51/20 |
| 10,819,967 B2* | 10/2020 | Khalid | H04N 13/122 |
| 10,835,828 B1* | 11/2020 | Pather | A63F 13/86 |
| 10,848,748 B2* | 11/2020 | Handa | H04N 5/2224 |
| 10,895,951 B2* | 1/2021 | Hutten | G06F 3/04815 |
| 10,922,583 B2* | 2/2021 | Kaehler | G06N 3/0454 |
| 10,944,960 B2* | 3/2021 | Matsunobu | H04N 13/117 |
| 2001/0019337 A1* | 9/2001 | Kim | H04L 29/06 715/757 |
| 2004/0109009 A1* | 6/2004 | Yonezawa | G06T 15/20 345/632 |
| 2006/0248510 A1* | 11/2006 | Dournov | G06F 30/20 717/124 |
| 2008/0085791 A1* | 4/2008 | Bucalo | A63B 67/002 473/490 |
| 2009/0059007 A1* | 3/2009 | Wagg | G06K 9/00711 348/157 |
| 2009/0060352 A1* | 3/2009 | Distante | G06K 9/527 382/224 |
| 2009/0099924 A1* | 4/2009 | Lensch | G06Q 10/101 705/14.13 |
| 2009/0129630 A1* | 5/2009 | Gloudemans | G06T 15/20 382/103 |
| 2009/0219283 A1* | 9/2009 | Hendrickson | H04N 13/128 345/420 |
| 2009/0315978 A1* | 12/2009 | Wurmlin | G06T 7/20 348/43 |
| 2010/0156906 A1* | 6/2010 | Montgomery | G06T 15/205 345/427 |
| 2010/0178644 A1* | 7/2010 | Meglan | G16H 50/50 434/267 |
| 2010/0190556 A1* | 7/2010 | Chan | A63F 13/10 463/43 |
| 2010/0197390 A1* | 8/2010 | Craig | G06K 9/00369 463/30 |
| 2010/0321383 A1* | 12/2010 | Nakamura | G06F 3/017 345/419 |
| 2011/0225498 A1* | 9/2011 | Goldman | G06Q 50/01 715/727 |
| 2011/0225514 A1* | 9/2011 | Goldman | G06Q 50/01 715/757 |
| 2011/0225515 A1* | 9/2011 | Goldman | G06Q 10/10 715/757 |
| 2011/0225516 A1* | 9/2011 | Goldman | G06Q 30/02 715/757 |
| 2011/0225517 A1* | 9/2011 | Goldman | G06T 19/00 715/757 |
| 2011/0225518 A1* | 9/2011 | Goldman | G06F 3/04815 715/757 |
| 2011/0244956 A1* | 10/2011 | Sakakibara | A63F 13/213 463/31 |
| 2011/0305398 A1* | 12/2011 | Sakakibara | G06K 9/00355 382/203 |
| 2011/0306420 A1* | 12/2011 | Nishimoto | G06F 3/005 463/36 |
| 2012/0004956 A1* | 1/2012 | Huston | G06Q 30/0207 705/14.1 |
| 2012/0015746 A1* | 1/2012 | Mooney | A63F 13/795 463/42 |
| 2012/0039526 A1* | 2/2012 | Garaas | G06T 17/05 382/154 |
| 2012/0056800 A1* | 3/2012 | Williams | G06F 3/011 345/156 |
| 2012/0088209 A1* | 4/2012 | Poole | F41A 33/00 434/11 |
| 2012/0122561 A1* | 5/2012 | Hedrick | G07F 17/32 463/25 |
| 2012/0128201 A1* | 5/2012 | Brickhill | G06K 9/00355 382/103 |
| 2012/0133638 A1* | 5/2012 | Davison | G06T 19/00 345/419 |
| 2012/0142415 A1* | 6/2012 | Lindsay | H04N 5/2224 463/33 |
| 2012/0159290 A1* | 6/2012 | Pulsipher | G06K 9/00369 714/819 |
| 2012/0233000 A1* | 9/2012 | Fisher | G06T 7/70 705/14.71 |
| 2012/0277003 A1* | 11/2012 | Eliovits | A63F 13/87 463/42 |
| 2012/0293513 A1* | 11/2012 | Krishnaswamy | H04N 13/156 345/423 |
| 2012/0309534 A1* | 12/2012 | Markovic | A63F 13/20 463/37 |
| 2012/0309540 A1* | 12/2012 | Holme | H04L 67/26 463/42 |
| 2012/0309541 A1* | 12/2012 | Kofman | H04L 67/38 463/42 |
| 2012/0311031 A1* | 12/2012 | Latta | G06Q 10/10 709/204 |
| 2012/0324401 A1* | 12/2012 | Morris | G06F 3/04815 715/836 |
| 2013/0031475 A1* | 1/2013 | Maor | G06Q 10/10 715/706 |
| 2013/0077835 A1* | 3/2013 | Kritt | G06K 9/00288 382/118 |
| 2013/0083173 A1* | 4/2013 | Geisner | G06F 3/1423 348/51 |
| 2013/0093788 A1* | 4/2013 | Liu | H04N 5/272 345/633 |
| 2013/0095924 A1* | 4/2013 | Geisner | G09B 19/0038 463/32 |
| 2013/0135315 A1* | 5/2013 | Bares | G11B 27/031 345/473 |
| 2013/0144727 A1* | 6/2013 | Morot-Gaudry | G06Q 30/02 705/14.72 |
| 2013/0165234 A1* | 6/2013 | Hall | A63F 13/12 463/42 |
| 2013/0208900 A1* | 8/2013 | Vincent | H04S 7/303 381/17 |
| 2013/0208926 A1* | 8/2013 | Vincent | H04S 7/303 381/300 |
| 2013/0215028 A1* | 8/2013 | Givon | G06F 3/011 345/158 |
| 2013/0271458 A1* | 10/2013 | Andriluka | G06K 9/00342 345/420 |
| 2013/0282504 A1* | 10/2013 | Lessin | G06Q 30/02 705/26.1 |
| 2013/0326364 A1* | 12/2013 | Latta | G02B 27/017 715/751 |

(56) References Cited

U.S. PATENT DOCUMENTS

| | | | |
|---|---|---|---|
| 2014/0038721 A1* | 2/2014 | Archer | A63F 13/795 463/42 |
| 2014/0038723 A1* | 2/2014 | Samdahl | A63F 13/216 463/42 |
| 2014/0128138 A1* | 5/2014 | Wickett | G07F 17/3237 463/13 |
| 2014/0139629 A1* | 5/2014 | Baiyya | A63F 13/06 382/103 |
| 2014/0143451 A1* | 5/2014 | Baiyya | A63F 13/06 710/9 |
| 2014/0172427 A1* | 6/2014 | Liu | G06F 16/345 704/239 |
| 2014/0219550 A1* | 8/2014 | Popa | G06K 9/00342 382/154 |
| 2014/0225922 A1* | 8/2014 | Sbardella | G06T 19/20 345/633 |
| 2014/0228124 A1* | 8/2014 | Plagge | G08C 23/04 463/39 |
| 2014/0267747 A1* | 9/2014 | Kritt | H04N 7/181 348/159 |
| 2014/0297745 A1* | 10/2014 | Tarbox | H04L 65/604 709/204 |
| 2014/0347479 A1* | 11/2014 | Givon | G06K 9/00342 348/143 |
| 2015/0002636 A1* | 1/2015 | Brown | H04N 13/356 348/47 |
| 2015/0035750 A1* | 2/2015 | Bailey | G06F 3/0346 345/158 |
| 2015/0082145 A1* | 3/2015 | Ames | G06F 3/0346 715/234 |
| 2015/0082180 A1* | 3/2015 | Ames | G06F 3/04815 715/738 |
| 2015/0082181 A1* | 3/2015 | Ames | G06F 3/0487 715/738 |
| 2015/0088622 A1* | 3/2015 | Ganschow | G06Q 50/01 705/14.5 |
| 2015/0234454 A1* | 8/2015 | Kurz | G06F 3/017 345/156 |
| 2015/0260474 A1* | 9/2015 | Rublowsky | A63F 13/213 434/16 |
| 2015/0261291 A1* | 9/2015 | Mikhailov | G06T 7/251 345/156 |
| 2015/0298010 A1* | 10/2015 | Trombetta | A63F 13/87 463/42 |
| 2015/0301592 A1* | 10/2015 | Miller | G06F 3/011 345/156 |
| 2015/0302514 A1* | 10/2015 | Trombetta | H04L 65/4076 705/27.2 |
| 2015/0304697 A1* | 10/2015 | Trombetta | A63F 13/00 725/116 |
| 2015/0348327 A1* | 12/2015 | Zalewski | H04M 1/05 345/419 |
| 2015/0375109 A1* | 12/2015 | Ward | A63F 13/211 463/32 |
| 2015/0379369 A1* | 12/2015 | Liang | G06K 9/4652 348/77 |
| 2016/0042566 A1* | 2/2016 | Mao | A63F 13/825 463/32 |
| 2016/0070356 A1* | 3/2016 | Aguirre | H04N 13/337 345/156 |
| 2016/0086500 A1* | 3/2016 | Kaleal, III | G06T 19/00 434/257 |
| 2016/0104322 A1* | 4/2016 | Fleischmann | G06F 3/017 345/419 |
| 2016/0105661 A1* | 4/2016 | Givon | G06K 9/3216 348/42 |
| 2016/0109938 A1* | 4/2016 | Hoof | G06F 3/011 463/33 |
| 2016/0148430 A1* | 5/2016 | Lin | G06F 3/011 345/420 |
| 2016/0148433 A1* | 5/2016 | Petrovskaya | G02B 27/01 345/633 |
| 2016/0170603 A1* | 6/2016 | Bastien | G06T 7/80 348/49 |
| 2016/0214011 A1* | 7/2016 | Weising | G06F 3/04815 |
| 2016/0228771 A1* | 8/2016 | Watson | A61B 5/4023 |
| 2016/0234556 A1* | 8/2016 | Berridge | H04N 21/4758 |
| 2016/0253844 A1* | 9/2016 | Petrovskaya | G06Q 50/01 345/633 |
| 2016/0263477 A1* | 9/2016 | Ladd | A63F 13/212 |
| 2016/0267808 A1* | 9/2016 | Agostini | G09B 5/06 |
| 2016/0299563 A1* | 10/2016 | Stafford | G06F 3/0487 |
| 2016/0322078 A1* | 11/2016 | Bose | G11B 27/031 |
| 2016/0360187 A1* | 12/2016 | Smithwick | G06T 19/20 |
| 2016/0371884 A1* | 12/2016 | Benko | G02B 27/017 |
| 2017/0006328 A1* | 1/2017 | Verticchio | H04N 21/4147 |
| 2017/0053447 A1* | 2/2017 | Chen | G06T 19/006 |
| 2017/0056771 A1* | 3/2017 | Davis | H04N 21/4781 |
| 2017/0064240 A1* | 3/2017 | Mangat | G06F 16/5866 |
| 2017/0080343 A1* | 3/2017 | Yamakawa | A63F 13/52 |
| 2017/0092002 A1* | 3/2017 | Mullins | G02B 27/0172 |
| 2017/0123487 A1* | 5/2017 | Hazra | G06F 3/015 |
| 2017/0126611 A1* | 5/2017 | Rajan | H04L 51/32 |
| 2017/0142341 A1* | 5/2017 | Ikeda | G06K 9/00771 |
| 2017/0151484 A1* | 6/2017 | Reilly | G09G 3/001 |
| 2017/0205892 A1* | 7/2017 | Petrovskaya | G06T 19/006 |
| 2017/0220568 A1* | 8/2017 | Dombrowski | G11B 27/19 |
| 2017/0238055 A1* | 8/2017 | Chang | G06F 3/013 725/19 |
| 2017/0243346 A1* | 8/2017 | Hall | G06K 9/00342 |
| 2017/0264936 A1* | 9/2017 | Depies | G06T 19/006 |
| 2017/0315697 A1* | 11/2017 | Jacobson | H04L 12/2816 |
| 2017/0316578 A1* | 11/2017 | Fua | G06T 7/246 |
| 2017/0318360 A1* | 11/2017 | Tran | H04Q 9/00 |
| 2017/0354875 A1* | 12/2017 | Marks | A63F 13/213 |
| 2017/0367771 A1* | 12/2017 | Tako | G06T 19/003 |
| 2018/0015347 A1* | 1/2018 | Janssen | H04W 4/025 |
| 2018/0018508 A1* | 1/2018 | Tusch | G06K 9/00771 |
| 2018/0025664 A1* | 1/2018 | Clarke | G09B 5/02 434/257 |
| 2018/0043263 A1* | 2/2018 | Cao | H04W 4/026 |
| 2018/0089895 A1* | 3/2018 | Anderson | G06F 3/0304 |
| 2018/0157455 A1* | 6/2018 | Troy | G06F 3/04842 |
| 2018/0181802 A1* | 6/2018 | Chen | G06K 9/00201 |
| 2018/0204481 A1* | 7/2018 | Nejat | A61B 5/11 |
| 2018/0218243 A1* | 8/2018 | Felsen | G06N 20/00 |
| 2018/0219894 A1* | 8/2018 | Crabtree | H04L 63/1425 |
| 2018/0227574 A1* | 8/2018 | Hefeeda | G06T 7/50 |
| 2018/0247241 A1* | 8/2018 | Avrahami | G06Q 10/0639 |
| 2018/0253141 A1* | 9/2018 | McCracken | A63F 13/245 |
| 2018/0260513 A1* | 9/2018 | Dweik | G06F 30/17 |
| 2018/0260532 A1* | 9/2018 | Dweik | G06F 30/17 |
| 2018/0278740 A1* | 9/2018 | Choi | H04M 1/72583 |
| 2018/0308287 A1* | 10/2018 | Daniels | G06T 19/20 |
| 2018/0311585 A1* | 11/2018 | Osman | A63F 13/212 |
| 2018/0315200 A1* | 11/2018 | Davydov | G06T 7/20 |
| 2018/0322680 A1* | 11/2018 | McElmurray | G06K 9/00255 |
| 2018/0349527 A1* | 12/2018 | Li | B25J 9/161 |
| 2018/0350084 A1* | 12/2018 | Tamir | G06T 7/292 |
| 2018/0372272 A1* | 12/2018 | Breitenfeld | H04N 21/8146 |
| 2018/0374267 A1* | 12/2018 | Yurkin | G06T 11/60 |
| 2019/0018554 A1* | 1/2019 | Fitzgerald | H04N 13/361 |
| 2019/0057620 A1* | 2/2019 | Eggert | G09B 23/28 |
| 2019/0102939 A1* | 4/2019 | He | G06T 19/003 |
| 2019/0102941 A1* | 4/2019 | Khan | H04N 13/243 |
| 2019/0121522 A1* | 4/2019 | Davis | G02B 27/0093 |
| 2019/0138880 A1* | 5/2019 | Akella | G06F 11/079 |
| 2019/0139297 A1* | 5/2019 | Chen | G06T 17/20 |
| 2019/0139300 A1* | 5/2019 | Kirchberg | G06T 17/00 |
| 2019/0158723 A1* | 5/2019 | Isbell | H04N 21/854 |
| 2019/0168120 A1* | 6/2019 | Cossairt | A63F 13/52 |
| 2019/0172224 A1* | 6/2019 | Vajda | G06T 7/77 |
| 2019/0172265 A1* | 6/2019 | Cossairt | G06F 3/011 |
| 2019/0180473 A1* | 6/2019 | Guleryuz | G06T 7/75 |
| 2019/0188533 A1* | 6/2019 | Katabi | G06K 9/00369 |
| 2019/0205645 A1* | 7/2019 | Bates | G06T 11/00 |
| 2019/0213798 A1* | 7/2019 | Griffin | G06T 15/205 |
| 2019/0222776 A1* | 7/2019 | Carter | G06K 9/00369 |
| 2019/0223819 A1* | 7/2019 | Mansi | A61B 5/7267 |
| 2019/0236364 A1* | 8/2019 | Hall | G06K 9/00671 |
| 2019/0251366 A1* | 8/2019 | Zhong | G06K 9/00724 |

(56) References Cited

U.S. PATENT DOCUMENTS

| | | | |
|---|---|---|---|
| 2019/0251720 A1* | 8/2019 | Hariton | G06T 13/40 |
| 2019/0253667 A1* | 8/2019 | Valli | H04S 7/303 |
| 2019/0259136 A1* | 8/2019 | Shpalensky | G06T 7/70 |
| 2019/0261027 A1* | 8/2019 | Hawke | H04N 21/44218 |
| 2019/0266780 A1* | 8/2019 | Le Floch | G06T 13/40 |
| 2019/0287310 A1* | 9/2019 | Kopeinigg | G06Q 50/01 |
| 2019/0294871 A1* | 9/2019 | Vaezi Joze | G06K 9/00369 |
| 2019/0304134 A1* | 10/2019 | Mauchly | G06T 15/20 |
| 2019/0329114 A1* | 10/2019 | Marty | A63B 69/0071 |
| 2019/0333245 A1* | 10/2019 | Zhao | G06K 9/00 |
| 2019/0347518 A1* | 11/2019 | Shrestha | G06K 9/00718 |
| 2019/0347826 A1* | 11/2019 | Zhang | G06T 7/73 |
| 2019/0355483 A1* | 11/2019 | Smurro | G16H 30/20 |
| 2019/0362149 A1* | 11/2019 | Mukhopadhyay | G06K 9/00288 |
| 2019/0362601 A1* | 11/2019 | Kline | G07F 17/3288 |
| 2019/0366153 A1* | 12/2019 | Zhang | A63B 24/0062 |
| 2019/0369613 A1* | 12/2019 | Moon | G05D 1/101 |
| 2019/0371030 A1* | 12/2019 | Roesler | G06T 13/20 |
| 2019/0371080 A1* | 12/2019 | Sminchisescu | G06T 19/20 |
| 2019/0371134 A1* | 12/2019 | Chen | G06K 9/6215 |
| 2019/0373017 A1* | 12/2019 | Lee | H04L 63/1408 |
| 2019/0377345 A1* | 12/2019 | Bachrach | G06K 9/00342 |
| 2019/0381404 A1* | 12/2019 | Buttner | G06N 3/08 |
| 2019/0384303 A1* | 12/2019 | Muller | G05D 1/0257 |
| 2019/0384420 A1* | 12/2019 | Cho | G06F 3/04815 |
| 2019/0392587 A1* | 12/2019 | Nowozin | G06N 3/08 |
| 2019/0392729 A1* | 12/2019 | Lee | A63B 71/0622 |
| 2020/0005138 A1* | 1/2020 | Wedig | G06T 13/40 |
| 2020/0005150 A1* | 1/2020 | Baughman | G06K 9/00342 |
| 2020/0005165 A1* | 1/2020 | Baughman | G06N 5/04 |
| 2020/0005539 A1* | 1/2020 | Hwang | G06F 3/167 |
| 2020/0005544 A1* | 1/2020 | Kim | G09B 5/02 |
| 2020/0012861 A1* | 1/2020 | Chan | H04N 21/8549 |
| 2020/0023262 A1* | 1/2020 | Young | A63B 71/0605 |
| 2020/0033880 A1* | 1/2020 | Kehl | G05D 1/0251 |
| 2020/0035019 A1* | 1/2020 | Cappello | G06T 7/70 |
| 2020/0039063 A1* | 2/2020 | Favis | B25J 11/0015 |
| 2020/0043287 A1* | 2/2020 | Zhang | G07F 17/3239 |
| 2020/0044997 A1* | 2/2020 | Jang | G06Q 30/00 |
| 2020/0051366 A1* | 2/2020 | Crist | G07F 17/323 |
| 2020/0057828 A1* | 2/2020 | Harrison | G16H 50/20 |
| 2020/0057889 A1* | 2/2020 | Lee | G06K 9/46 |
| 2020/0082636 A1* | 3/2020 | Rudell | A63F 13/26 |
| 2020/0126310 A1* | 4/2020 | Maneri | G06F 3/017 |
| 2020/0128902 A1* | 4/2020 | Brown | A42B 3/042 |
| 2020/0133618 A1* | 4/2020 | Kim | H04N 21/2187 |
| 2020/0134780 A1* | 4/2020 | Chapiro | G02B 27/0172 |
| 2020/0134911 A1* | 4/2020 | van Hoff | G06T 13/20 |
| 2020/0151965 A1* | 5/2020 | Forbes | G06F 16/285 |
| 2020/0193671 A1* | 6/2020 | Tamir | G06T 7/251 |
| 2020/0209958 A1* | 7/2020 | Sztuk | G06F 3/017 |
| 2020/0218767 A1* | 7/2020 | Ritchey | H04N 7/18 |
| 2020/0219323 A1* | 7/2020 | Varshney | H04L 51/32 |
| 2020/0249819 A1* | 8/2020 | Berquam | G06F 3/011 |
| 2020/0306640 A1* | 10/2020 | Kolen | A63F 13/213 |
| 2020/0309944 A1* | 10/2020 | Thoresen | G01S 13/89 |
| 2020/0334285 A1* | 10/2020 | Veitch | G06F 16/54 |
| 2020/0357183 A1* | 11/2020 | Weber | G06T 19/006 |
| 2020/0405212 A1* | 12/2020 | Chappell, III | A63F 13/352 |
| 2021/0001174 A1* | 1/2021 | Kantorovich | G06N 20/00 |
| 2021/0038975 A1* | 2/2021 | Grillet | A63F 13/213 |
| 2021/0041950 A1* | 2/2021 | von und zu Liechtenstein | G06F 3/04847 |
| 2021/0060405 A1* | 3/2021 | Karafin | G02B 30/56 |
| 2021/0117042 A1* | 4/2021 | Kurz | G06F 3/011 |
| 2021/0118065 A1* | 4/2021 | Li | G06Q 50/01 |

* cited by examiner

GENERATING THREE-DIMENSIONAL CONTENT FROM TWO-DIMENSIONAL IMAGES

CROSS REFERENCE TO RELATED APPLICATIONS

This application is a continuation-in-part of U.S. patent application Ser. No. 16/241,991, entitled "Generating Three-Dimensional Content from Two-Dimensional Images" filed Jan. 8, 2019, which claims the benefit of U.S. Provisional Application No. 62/614,899, entitled "Generating Three-Dimensional Content from Two-Dimensional Images" filed Jan. 8, 2018, each of which is incorporated by reference.

FIELD

The embodiments discussed herein are related to generating three-dimensional content from two-dimensional videos.

BACKGROUND

Generating a three-dimensional model of a sporting event may be difficult when the boundaries of the sporting event change. This is particularly true when the three-dimensional model includes a player in the sporting event because the player is moving so quickly, it can be difficult to accurately simulate the movement.

SUMMARY

In some embodiments a method includes receiving two-dimensional video streams from a plurality of cameras, the two-dimensional video streams including multiple angles of a sporting event, determining boundaries of the sporting event from the two-dimensional video streams, identifying a location of a sporting object during the sporting event, identifying one or more players in the sporting event, identifying poses of each of the one or more players during the sporting event, generating a three-dimensional model of the sporting event based on the boundaries of the sporting event, the location of the sporting object during the sporting event, and the poses of each of the one or more players during the sporting event, and generating a simulation of the three-dimensional model.

In some embodiments, a sporting event is an example of a live event. A live event includes any type of event that is live such as a sporting event, a concert, a play, news, war zone footage, an art show, a press conference, a speech, or any other type of live event.

The method may further include providing the simulation to a cross reality system. In some embodiments, the cross reality system includes augmented reality glasses and the simulation is overlaid onto real-world elements. The method may further include generating a machine learning model, wherein the machine learning model is used to determine the boundaries, identify the location of the sporting event, identify the poses of each of the one or more players, generate the three-dimensional model, and generate the simulation. In some embodiments, the machine learning model is generated by at least one of a deep neural network, a convolutional neural network, and a recurrent neural network. In some embodiments, identifying the poses of the one or more players during the sporting event includes generating a skeletal model of each of the one or more players and the skeletal model predicts a location of corresponding body parts that are obscured in image frames of the two-dimensional video streams. The method may further include classifying people that are in the two-dimensional video streams including the one or more players, where predicting the location of corresponding body parts that are obscured in the image frames includes applying a classification of the people to determine whether the corresponding body parts are obscured by the one or more players or an other person. The method may further include identifying one or more social network profiles that correspond to people that are in the two-dimensional video streams, wherein the people include spectators to the sporting event and providing one or more links to the one or more social network profiles within the simulation. The method may further include identifying one or more social network profiles that correspond to the one or more players and providing one or more links to the one or more social network profiles within the simulation.

In some embodiments, a system comprises one or more processors coupled to a memory, a processing module stored in the memory and executable by the one or more processors, the processing module operable to receive two-dimensional video streams from a plurality of cameras, the two-dimensional video streams including multiple angles of a sporting event, a machine learning module stored in the memory and executable by the one or more processors, the machine learning module operable to generate a machine learning model to determine boundaries of the sporting event from the two-dimensional video streams and identify a location of a sporting object during the sporting event, a tracking module stored in the memory and executable by the one or more processors, the tracking module operable to, based on the machine learning model, identify one or more players in the sporting event and identify poses of each of the one or more players during the sporting event, and a simulation module stored in the memory and executable by the one or more processors, the simulation module operable to, based on the machine learning model, generate a three-dimensional model of the sporting event based on the boundaries of the sporting event, the location of the sporting object during the sporting event, and the poses of each of the one or more players during the sporting event and generate a simulation of the three-dimensional model.

In some embodiments, the system further comprises a user interface module stored in the memory and executable by the one or more processors, the user interface module operable to provide the simulation to a cross reality system. In some embodiments, the cross reality system includes augmented reality glasses and the simulation is overlaid onto real-world elements. In some embodiments, the machine learning model is generated by at least one of a deep neural network, a convolutional neural network, and a recurrent neural network. In some embodiments, identifying the poses of the one or more players during the sporting event includes generating a skeletal model of each of the one or more players and the skeletal model predicts a location of corresponding body parts that are obscured in image frames of the two-dimensional video streams.

In some embodiments, a computer storage medium encoded with a computer program, the computer program comprising instructions that, when executed by one or more processors, cause the one or more processors to perform operations comprising: receiving two-dimensional video streams from a plurality of cameras, the two-dimensional video streams including multiple angles of a sporting event, determining boundaries of the sporting event from the two-dimensional video streams, identifying a location of a sporting object during the sporting event, identifying one or more players in the sporting event, identifying poses of each of the one or more players during the sporting event, generating a three-dimensional model of the sporting event based on the boundaries of the sporting event, the location of the sporting object during the sporting event, and the poses of each of the one or more players during the sporting event, and generating a simulation of the three-dimensional model.

In some embodiments, the operations further include providing the simulation to a cross reality system. In some embodiments, the cross reality system includes augmented reality glasses and the simulation is overlaid onto real-world elements. In some embodiments, the operations further include generating a machine learning model, wherein the machine learning model is used to determine the boundaries, identify the location of the sporting event, identify the poses of each of the one or more players, generate the three-dimensional model, and generate the simulation. In some embodiments, the machine learning model is generated by at least one of a deep neural network, a convolutional neural network, and a recurrent neural network. In some embodiments, identifying the poses of the one or more players during the sporting event includes generating a skeletal model of each of the one or more players and the skeletal model predicts a location of corresponding body parts that are obscured in image frames of the two-dimensional video streams.

The disclosure is particularly advantageous in a number of respects. First, the cross reality (XR) application solves a problem of defining boundaries in a sporting event by confining the event to a fixed space. Second, the XR application computes the boundary, the location of a sporting object, and a pose for each player in the sporting event using a machine learning model. As a result of the above, a simulation of a three-dimensional model may be generated in real time or near real-time.

DESCRIPTION OF EMBODIMENTS

Example System 100

Figure 1:
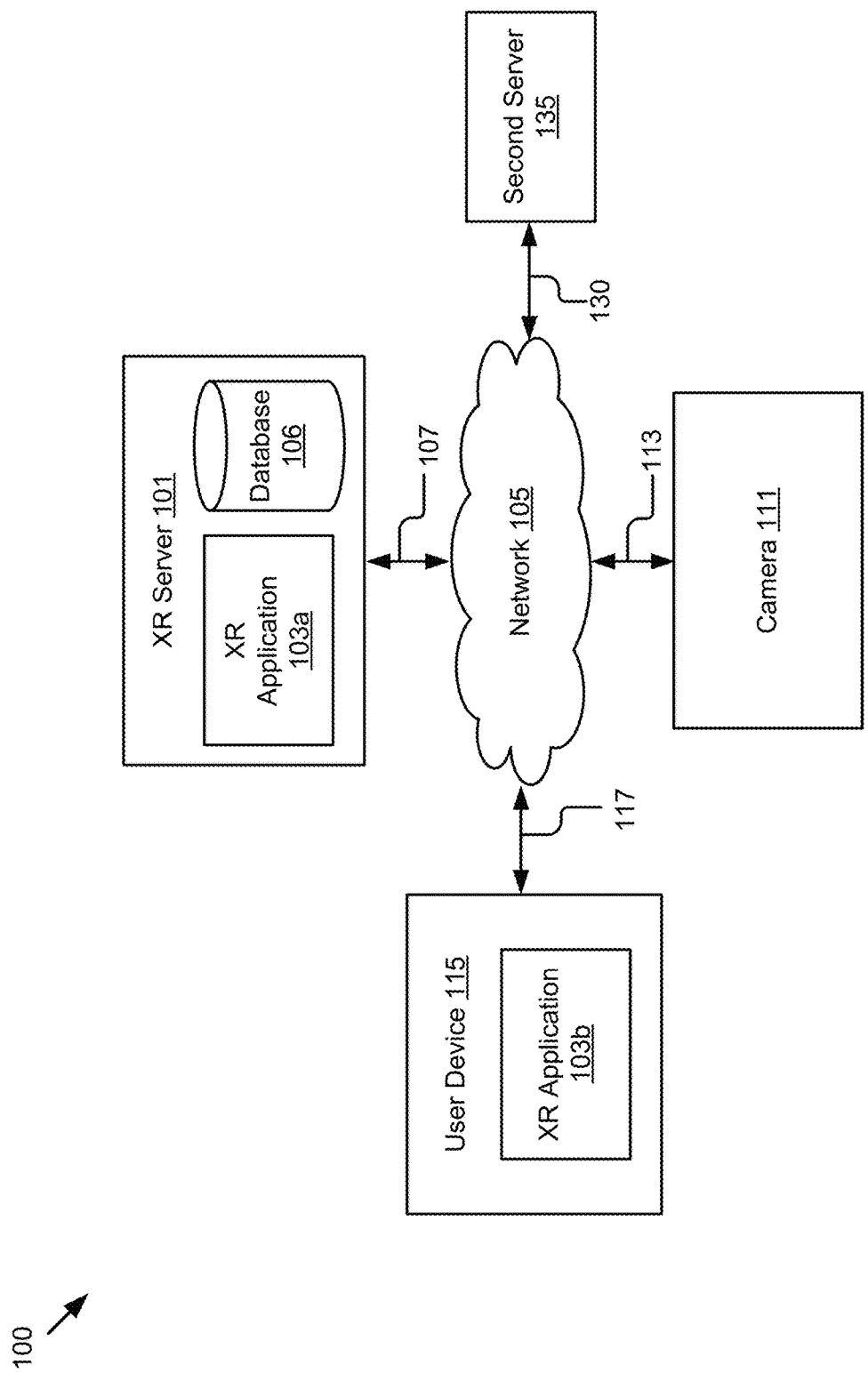
FIG. 1 illustrates an example system that generates three-dimensional (3D) content from two-dimensional (2D) videos according to some embodiments.

FIG. 1 illustrates an example system that generates three-dimensional (3D) content from two-dimensional (2D) videos. The system 100 comprises a camera 111, a XR server 101, a user device 115, and a second server 135.

While FIG. 1 illustrates one camera 111, one XR server 101, one user device 115, and one second server 135, the disclosure applies to a system architecture having one or more cameras 111, one or more XR servers 101, one or more user devices 115, and one or more second servers 135. Furthermore, although FIG. 1 illustrates one network 105 coupled to the entities of the system 100, in practice one or more networks 105 may be connected to these entities and the one or more networks 105 may be of various and different types.

The network 105 may be a conventional type, wired or wireless, and may have numerous different configurations including a star configuration, token ring configuration, or other configurations. Furthermore, the network 105 may include a local area network (LAN), a wide area network (WAN) (e.g., the Internet), or other interconnected data paths across which multiple devices may communicate. In some embodiments, the network 105 may be a peer-to-peer network. The network 105 may also be coupled to or include portions of a telecommunications network for sending data in a variety of different communication protocols. In some embodiments, the network 105 may include Bluetooth™ communication networks or a cellular communication network for sending and receiving data including via hypertext transfer protocol (HTTP), direct data connection, etc.

The camera 111 may comprise any device that captures video data. For example, the camera 111 may be a mobile device with a lens, a camera array with multiple camera modules at different angles, a video recorder, etc. The camera 111 may communicate with the XR server 101, the user device 115, and/or the second server 135 by accessing the network 105 via signal line 113. Signal line 113 may represent a wireless or a wired connection. For example, the camera 111 may wirelessly transmit video data over the network 105 to the XR server 101. In some embodiments, the camera 111 may be directly connected to the user device 115. For example, the camera 111 may be connected to the user device 115 via a universal serial bus (USB) cable.

The XR server 101 may be a hardware server that includes an XR application 103a, a database 106, and network communication capabilities. In some embodiments, the XR application 103a can be implemented using hardware including a field-programmable gate array ("FPGA") or an application-specific integrated circuit ("ASIC"). In some other embodiments, the XR application 103a may be implemented using a combination of hardware and software. The XR server 101 may communicate with the network 105 via signal line 107.

The XR server 101 hardware may include a processor, a memory, a communication unit (not illustrated), the XR application 103a, and a database 106. The XR application 103a may receive 2D images that include multiple angles of a sporting event from the camera 111 via the network 105. In some embodiments, the XR application 103a performs the steps of the method 700 of FIG. 7. In some embodiments, the XR application 103a can be implemented using hardware including a field-programmable gate array ("FPGA") or an application-specific integrated circuit ("ASIC"). In some other embodiments, the XR application 103a may be implemented using a combination of hardware and software.

In some embodiments, a sporting event is an example of a live event. A live event includes any type of event that is live such as a sporting event, a concert, a play, news, war zone footage, an art show, a press conference, a speech, or any other type of live event. As used herein, the term "sporting event" may be replaced by the term "live event." Accordingly, the term "sporting event" is used herein as an example of the functionality provided by the XR application 103a according to some embodiments.

The XR application 103a may generate a 3D model of the sporting event and a simulation of the 3D model. The 3D model may be presented as XR, which encompasses all real-and-virtual combined environments and human-machine interactions generated by the XR server 101. In some embodiments, the "X" in "XR" is a variable that defines a continuum that can be expanded and extended. In some embodiments, the "X" in "XR" is a multivariable. In some embodiments, XR includes one or more of the following types of digital content: cross reality; extended reality; augmented reality (AR), virtual reality (VR), and mixed reality (MR). In some embodiments, XR includes digital content that is displayed by an electronic display or some other electronic device suitable for displaying XR.

In some embodiments, extended reality refers to all real-and-virtual combined environments and human-machine interactions generated by computer technology and wearables.

In some embodiments, AR includes digital content that depicts a real-world environment with elements that are augmented by computer-generated sensory input including sound, video, graphics, or global-positioning system (GPS) data.

In some embodiments, VR includes digital content that depicts a virtual environment of images, sounds, and other media that replicate a real environment or a synthetic environment.

In some embodiments, MR includes a synthesis of real and virtual worlds to produce new environments and visualizations where physical and digital objects coexist and interact in real time.

The database 106 may store the 2D images, 3D content, etc. The database 106 is coupled to the bus 220 via signal line 240.

The user device 115 may be a processor-based computing device. For example, the user device 115 may be a personal computer, laptop, tablet computing device, smartphone, set top box, network-enabled television, or any other processor based computing device. In some embodiments, the user device 115 includes network functionality and is communicatively coupled to the network 105 via a signal line 117. The user device 115 may be configured to receive data from the XR server 101 via the network 105. A user may access the user device 115.

In FIG. 1 and the remaining figures, a letter after a reference number represents a reference to the element having that particular reference number. For example, 103a refers to the 3D content application stored on the XR server 101 and 103b refers to the 3D content application stored on the user device 115. A reference number in the text without a following letter represents a general reference to embodiments of the element bearing that reference number. For example, 103 refers to the 3D content application in general.

The user device 115 may include a XR application 103b. The XR application 103b may include the same components as the XR application 103a stored on the XR server 101 or different components. For example, the XR application 103a on the XR server 101 may generate the 3D content from 2D videos and the XR application 103b on the user device 115 may include a user interface component for displaying the 3D content generated by the XR application 103a on the XR server 101.

The second server 135 may be a hardware server that includes a processor, a memory, a database, and network communication capabilities. In the illustrated embodiment, the second server 135 is coupled to the network 105 via signal line 130. The second server 135 sends and receives data to and from one or more of the other entities of the system 100 via the network 105. For example, the second server 135 may provide the XR server 101 with 2D videos that are stored in the database 106 of the XR server 101. The 2D videos may include 2D images of a movable object and/or 2D images that include multiple angles of a sporting event.

In some embodiments, the second server 135 may include a social network application. The social network application may generate user profiles for users that are used to personalize the 3D content generated by the 3D content application.

Example Computing Device 200

Figure 2:
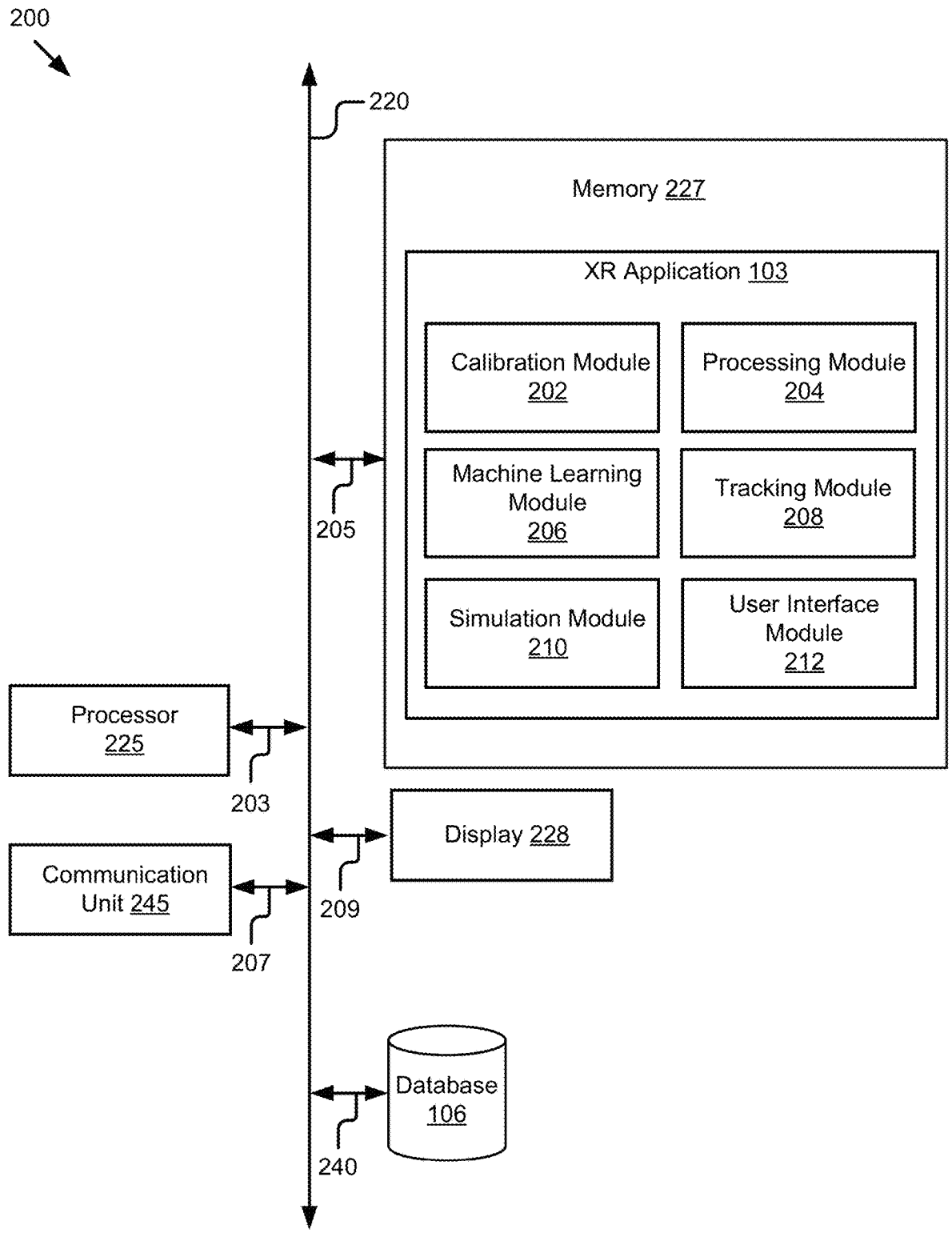
FIG. 2 illustrates a block diagram of an example device that generates 3D content from 2D videos according to some embodiments.

FIG. 2 illustrates a block diagram of an example device 200 that generates 3D content from 2D videos according to some embodiments. The computing device 200 may be the XR server 101 or the user device 115. In some embodiments, the computing device 200 may include a special-purpose computing device configured to provide some or all of the functionality described below with reference to FIG. 2.

FIG. 2 may include a processor 225, a memory 227, a communication unit 245, and a display 228. The processor 225, the memory 227, the communication unit 245, and the display 228 are communicatively coupled to the bus 220. Other hardware components may be part of the computing device 200, such as sensors (e.g., a gyroscope, accelerometer), etc.

The processor 225 may include an arithmetic logic unit, a microprocessor, a general-purpose controller, or some other processor array to perform computations and provide electronic display signals to a display device. The processor 225 processes data signals and may include various computing architectures including a complex instruction set computer (CISC) architecture, a reduced instruction set computer (RISC) architecture, or an architecture implementing a combination of instruction sets. Although FIG. 2 includes a single processor 225, multiple processors may be included. Other processors, operating systems, sensors, displays, and physical configurations may be possible. The processor 225 is coupled to the bus 220 for communication with the other components via signal line 203.

The memory 227 stores instructions or data that may be executed by the processor 225. The instructions or data may include code for performing the techniques described herein. For example, the memory 227 may store the XR application 103, which may be a series of modules that include instructions or data for generating a simulation of the 3D model.

The memory 227 may include a dynamic random access memory (DRAM) device, a static random access memory (SRAM) device, flash memory, or some other memory device. In some embodiments, the memory 227 also includes a non-volatile memory or similar permanent storage device and media including a hard disk drive, a CD- ROM device, a DVD-ROM device, a DVD-RAM device, a DVD-RW device, a flash memory device, or some other mass storage device for storing information on a more permanent basis. The memory 227 is coupled to the bus 220 for communication with the other components via signal line 205.

The communication unit 245 may include hardware that transmits and receives data to and from the camera 111, the user device 115 or the XR server 101, or the second server 135 depending on whether the XR application 103 is stored on the XR server 101 or the user device 115, respectively. The communication unit 245 is coupled to the bus 220 via signal line 207. In some embodiments, the communication unit 245 includes one or more ports for direct physical connection to the network 125 or another communication channel. For example, the communication unit 245 includes a USB, SD, CAT-5, or similar port for wired communication with the computing device 200. In some embodiments, the communication unit 245 includes a wireless transceiver for exchanging data with the computing device 200 or other communication channels using one or more wireless communication methods, including IEEE 802.11, IEEE 802.16, Bluetooth®, or another suitable wireless communication method.

In some embodiments, the communication unit 245 includes a cellular communications transceiver for sending and receiving data over a cellular communications network including via short messaging service (SMS), multimedia messaging service (MMS), hypertext transfer protocol (HTTP), direct data connection, WAP, e-mail, or another suitable type of electronic communication. In some embodiments, the communication unit 245 includes a wired port and a wireless transceiver. The communication unit 245 also provides other conventional connections to the network 125 for distribution of files or media objects using standard network protocols including TCP/IP, HTTP, HTTPS, and SMTP, etc.

The display 228 may include hardware for displaying graphical data from the XR application 103. For example, the display 228 renders graphics for displaying a user interface where a user may view the simulation of the 3D model and controls for modifying the display of the 3D model. The display 228 is coupled to the bus 220 via signal line 209. The display 228 is optional hardware that may not be included in the computing device 200, for example, if the computing device 200 is a server.

The XR application 103 may include a calibration module 202, a processing module 204, a machine learning module 206, a tracking module 208, a simulation module 210, and a user interface module 212. Although the modules are illustrated as being part of the same computing device 200, in some embodiments some of the modules are stored on the XR server 101 and some of the modules are stored on the user device 115. For example, the XR server 101 may include the calibration module 202, the processing module 204, the machine learning module 206, the tracking module 208, and the simulation module 210, and the user device 115 may include the user interface module 212.

The calibration module 202 may be software including routines for calibrating the camera 111. In some embodiments, the calibration module 202 includes a set of instructions executable by the processor 225 to calibrate the cameras 111. In some embodiments, the calibration module 202 is stored in the memory 227 of the computing device 200 and is accessible and executable by the processor 225.

Figure 3:
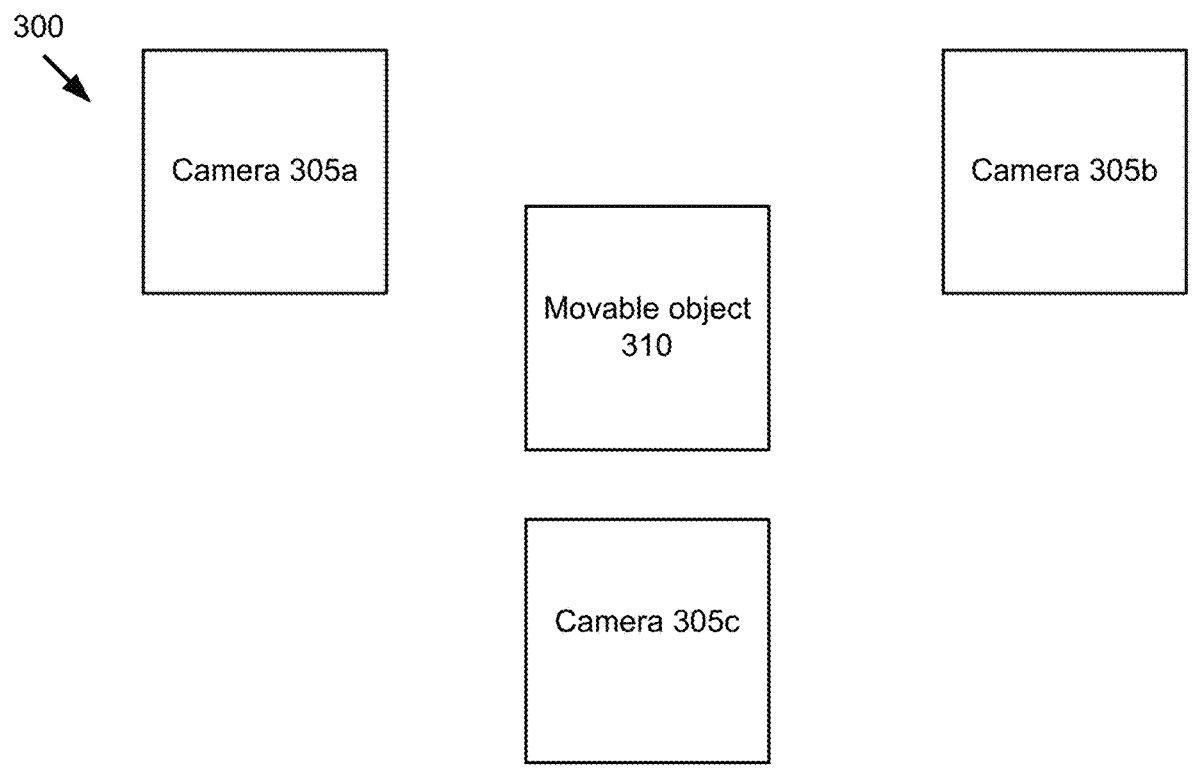
FIG. 3 illustrates a block diagram of an example camera configuration for generating the 3D content according to some embodiments.

In some embodiments, the calibration module 202 calibrates a single camera 111. In other embodiments, the calibration module 202 calibrates multiple cameras 111. For example, FIG. 3 illustrates a block diagram 300 of an example camera configuration for generating the 3D content. In some embodiments, three cameras 305a, 305b, 305c are used to capture two-dimensional images of a movable object 310. The movable object 310 may include, for example, players in a soccer match. The cameras 305 may be depth cameras that use passive infrared, such as the Intel® RealSense™ depth camera, but other cameras may be used, such as a time-of-flight camera. Although three cameras 305 are illustrated, more cameras may be used. In some embodiments, it is advantageous to use multiple cameras 305 that capture color so that the textures of the movable object 310 may be reproduced for the 3D model.

In some embodiments, lenses included in the cameras 111 may have some amount of spherical distortion. Images captured with the cameras 111 may have a barrel distortion or a pin-cushion distortion that needs to be corrected during creation of panoramic images from the distorted images. The barrel distortion may be referred to as a "fish eye effect." For each camera 111, the calibration module 202 calibrates a lens to determine associated distortion caused by the lens. For example, a snapshot of a test pattern that has known geometries placed in a known location (e.g., a checkerboard in a known location) may be captured by the cameras 111.

Figure 4:
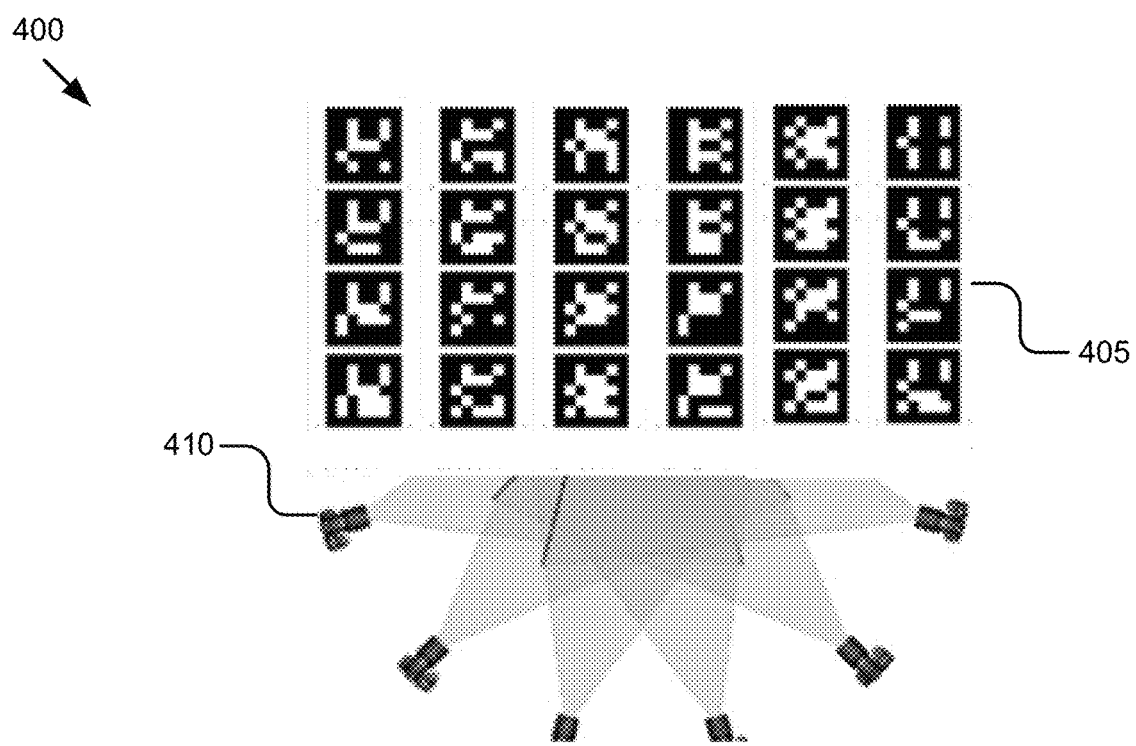
FIG. 4 illustrates a block diagram an example sample used for calibration of the 3D content application according to some embodiments.

FIG. 4 illustrates a block diagram 400 of an example sample 405 used for calibration of the XR application 103 according to some embodiments. In this example, six cameras 410 capture images of the sample 405 and use the sample 405 to calibrate the cameras 111. The sample may be a cube with unique markers, such as a cube with ArUco markers. The XR application 103 may use iterative point cloud (ICP) for refined calibration.

The calibration module 202 may determine properties of a lens included in the camera 111 from the snapshot of the test pattern. Properties of a lens may include, but are not limited to, distortion parameters, an optical center, and other optical properties associated with the lens.

The calibration module 202 stores data describing the properties of each lens in a configuration file. The configuration file may include data describing properties of all lenses of the cameras 111. For example, the configuration file includes data describing distortion parameters, an optical center, and other optical properties for the lenses.

The processing module 204 may be software including routines for processing video data from the cameras 111. In some embodiments, the processing module 204 includes a set of instructions executable by the processor 225 to process the video data. In some embodiments, the processing module 204 is stored in the memory 227 of the computing device 200 and is accessible and executable by the processor 225.

The processing module 204 may receive video data from cameras 111 at different angles. In some embodiments, the processing module 204 performs a check to ensure that the video data includes multiple angles of the sporting event. If the video data fails to include multiple angles of the sporting event, the processing module 204 may instruct the user interface module 212 to generate a notification for a user to obtain video data from a camera 111 at a different angle from the other video data.

Figure 5A:
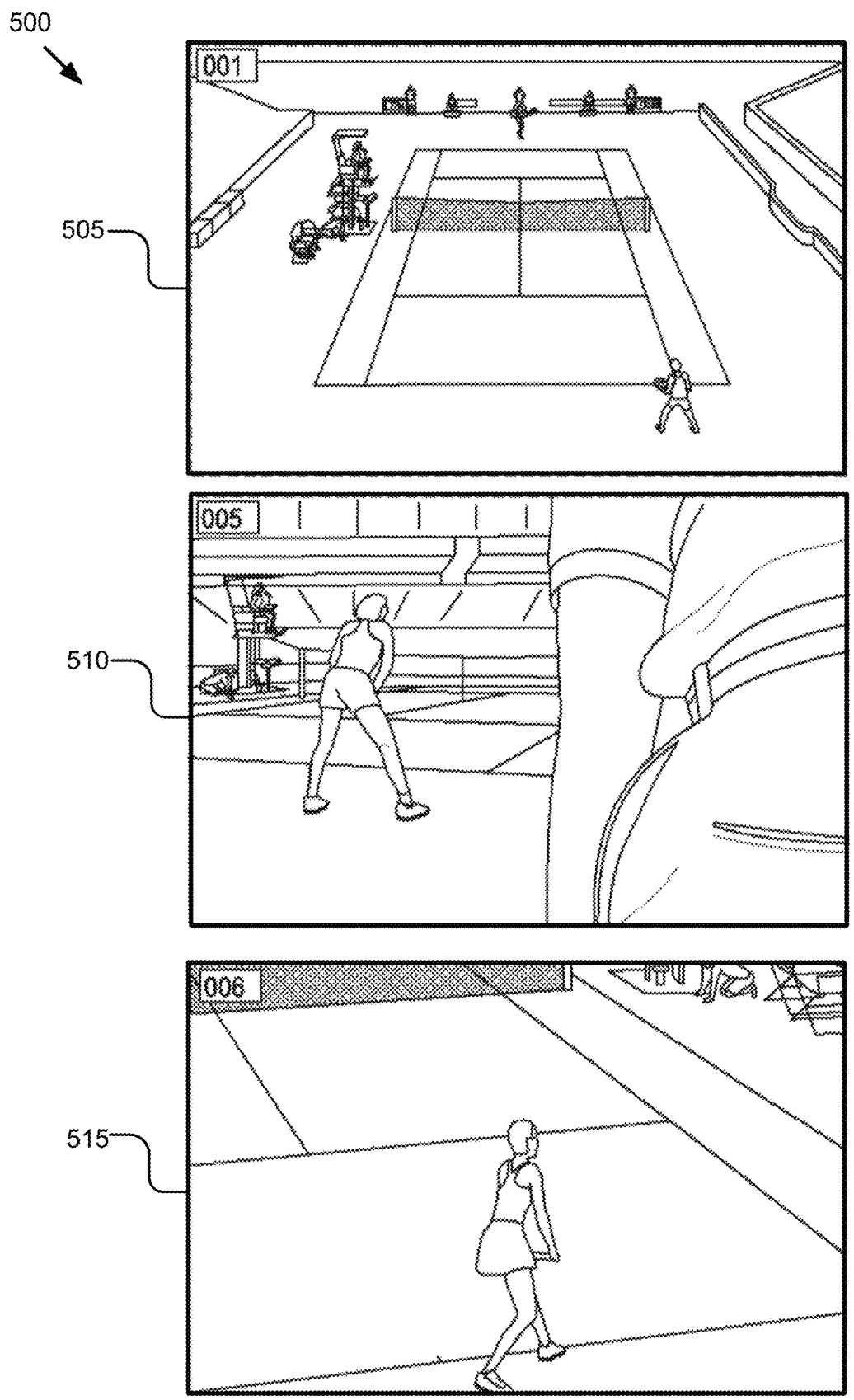
FIG. 5A illustrates a block diagram of example images with different angles of a tennis match that are used to generate 3D content according to some embodiments.

FIG. 5A illustrates a block diagram 500 of example images with different angles of a tennis match that are used to generate 3D content according to some embodiments. In this example, the 2D images include a long shot of the tennis match 505, a close-up of a first player 510, and a close-up of a second player 515. The numbers in the upper left-hand corner may represent a frame number in the video. Because the images are taken at different angles, previous attempts to define the boundaries of the sporting event were difficult.

In some embodiments, the processing module 204 determines boundaries of the sporting event. For example, where the sporting event is a tennis match, the boundaries of the tennis match are any area where the players may be located during the tennis match. In another example, where the sporting event is a football game, the boundaries of the football game may be the sidelines of the football field.

The processing module 204 may receive a location of a camera 111, where the camera 111 is pointing in space and 2D images associated with the camera 111. The processing module 204 may identify the yaw, pitch, and position of each of the cameras 111. In some embodiments, the processing module 204 uses the configuration file generated by the calibration module 202 to stitched together the image frames from the video data of multiple cameras 111 based on the calibration of relative positions of each camera 111. The processing module 204 may use keypoints for each image frame and simultaneous localization and mapping (SLAM) to try and understand the camera 111 position, how it is moving, and how far away from the field the camera 111 is. The processing module 204 may build a model with keypoints and markerless points.

The machine learning module 206 may include code and routines for generating a machine learning model. In some embodiments, the machine learning module 206 includes a set of instructions executable by the processor 225 to generate a machine learning model. In some embodiments, the machine learning module 206 is stored in the memory 227 of the computing device 200 and is accessible and executable by the processor 225.

In some embodiments, the machine learning module 206 identifies a location of a sporting object during the sporting event. Specifically, the machine learning module 206 may identify the location of the sporting object in frames of the video of the sporting event. The sporting object may include a football, tennis ball, soccer ball, basketball, baseball, softball, etc.

Figure 5B:
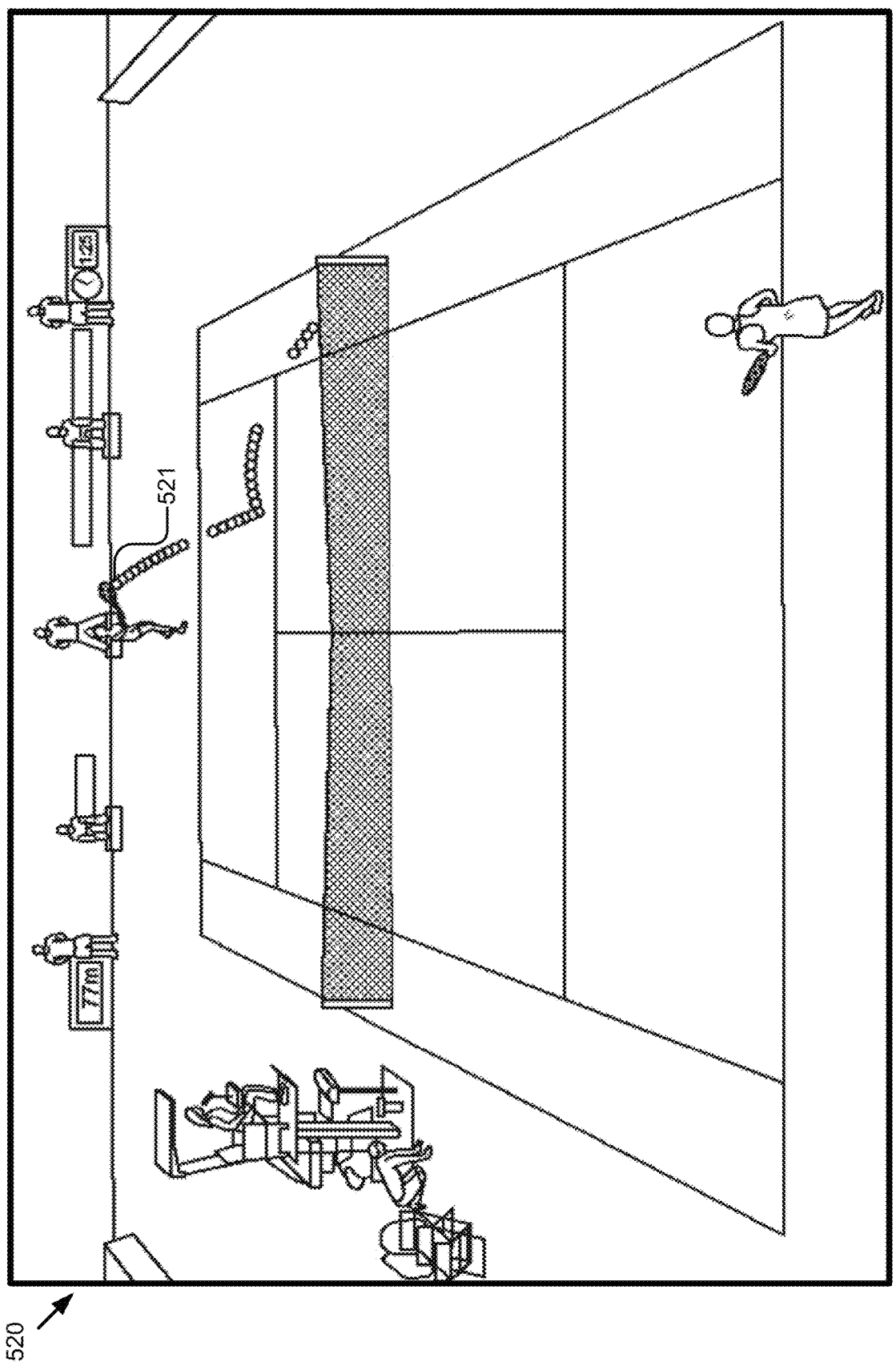
FIG. 5B illustrates a block diagram of ball detection during the tennis match according to some embodiments.

The machine learning module 206 may generate a machine learning model that predicts a location of the sporting object during the sporting event. The machine learning module 206 may track the location of the ball for each frame of the sporting event. In some embodiments, the machine learning module 206 uses keypoints and the machine learning model to identify the location of the ball in the 2D images that correspond to each camera 111. The machine learning module 206 may determine launch velocity, speed of the ball, spin of the ball, any modification due to wind resistance, and a height of the ball. The machine learning module 206 may minimize reprojection error, which is a difference between what the camera detected and where the ball is estimated to be located. As a result, the 3D content application may determine a 3D trajectory for the ball. FIG. 5B illustrates a block diagram 520 of ball detection during the tennis match according to some embodiments. In this example, a path of the tennis ball 521 is illustrated and tracked by the processing module.

One problem that arises with having 2D images with different fields of view (FOV) is that the machine learning module 206 may have trouble identifying a location of a player when the 2D image shows a closeup. Because the 2D images use monocular vision, it may be difficult to identify the location of all of the body parts of the players. As a result, the machine learning module 206 generates a machine learning model, such as through the use of a neural network, to learn about human anatomy to find the location of the body parts. The machine learning module 206 may use videos of body parts as its training set and then stitch the 2D images from the different cameras 111 to create the machine learning model that includes the pose estimation.

Another problem that arises is that the machine learning module 206 may have trouble identifying which body parts belong to which player and predict motion of the body parts. For example, the machine learning module 206 may have difficulty identifying what appears to be a new arm on a player when it is actually overlap of the player with a referee that is standing close to the player. In addition, there may be times when the machine learning module 206 lacks enough information to create a model of a player's body. This may be particularly problematic in a sporting event because there will be times when the 2D images are lacking part of a player's body. For example, if another person walks in front of a player, the 2D images may lack images of the player during that particular time frame.

The machine learning module 206 generates a machine learning model that identifies poses of the player during the sporting event by predicting the location of the player's body, even when the 2D image partially or fully obscures the player. For example, if a player's arm moves behind their body, the machine learning module 206 may still be able to track the location of the player's arm even though it is not visible.

In some embodiments, the machine learning module 206 generates a machine learning model that is used to create a 3D model that works in substantially real-time. The machine learning module 206 may include deep neural networks, convolutional neural networks, or recurrent neural networks. The advantage of a recurrent neural network is that it remembers the motion and does not treat subsequent motion as a brand-new event each time motion occurs. As a result, the machine learning module 206 is able to predict the motion of a player, such as a person hitting a ball. The machine learning module 206 may therefore use the machine learning model to predict the movements of the players and fill in any gaps that may occur due to the camera angles failing to capture all of the motion.

In some embodiments, the machine learning module 206 uses training data to create the machine learning model that tracks a location of body parts of a player and that is used to generate a simulation. For example, the machine learning module 206 may receive training data that includes videos of body parts. The videos may be videos of discrete body parts that the machine learning module 206 stitches together to create bodies. The videos may include labels of each of the body parts so that the machine learning module 206 generates a body with the body parts that performs pose estimation that estimates the location of the body parts and predicts how the body parts move.

Figure 5C:
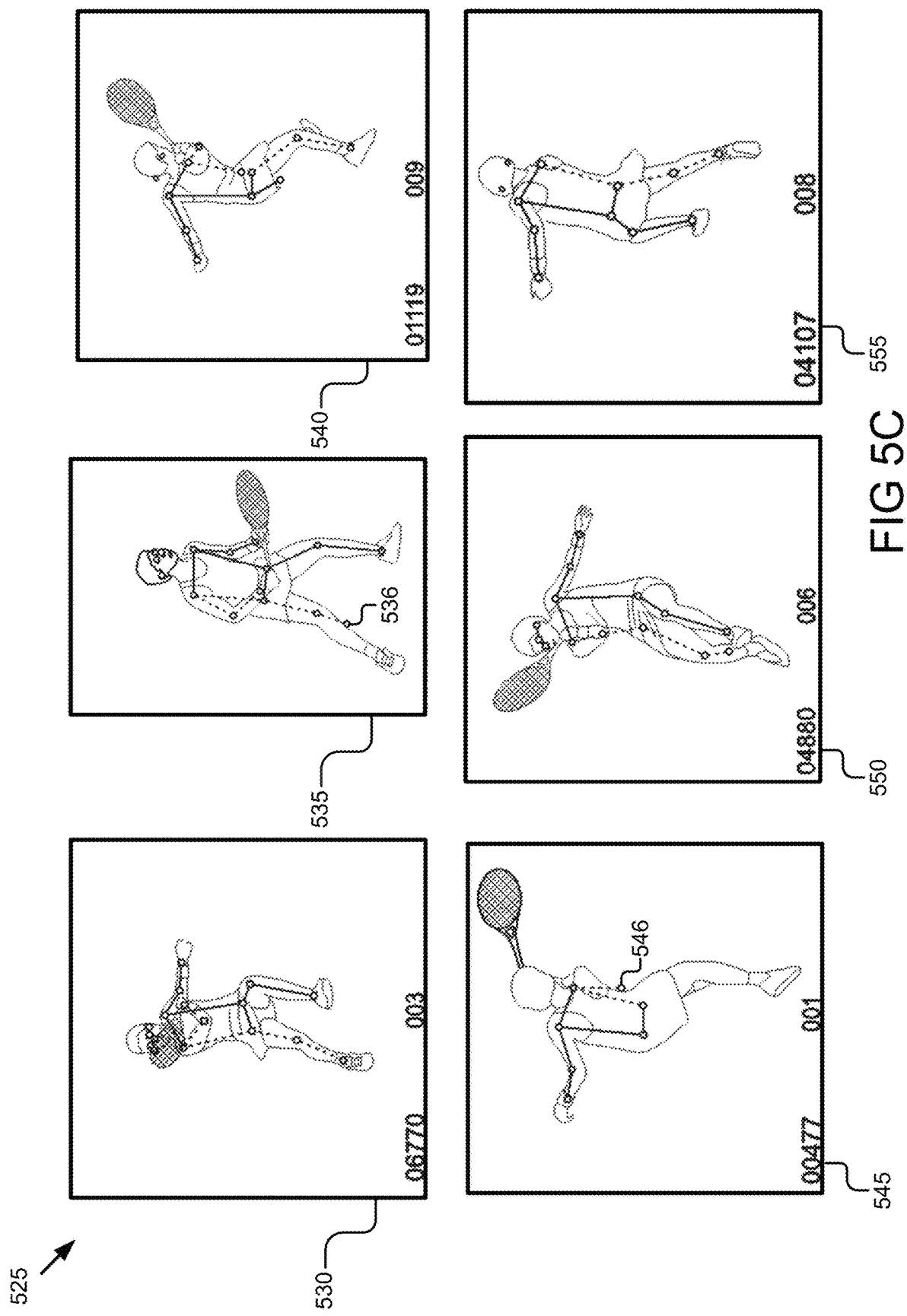
FIG. 5C illustrates a block diagram of pose detection of the players of the tennis match according to some embodiments.

In some embodiments, the machine learning module 206 generates a skeletal model of the player that identifies a location of the player's skeleton. FIG. 5C illustrates a block diagram 525 of pose detection of the players of the tennis match according to some embodiments. Video frame 530 illustrates an example skeletal model of a front view of a tennis player. The skeletal model uses solid lines for the left-most part of the player and dashed lines for the right-most part of the player for ease of illustration.

In some embodiments, the machine learning module 206 may use the machine learning model to predict the location of body parts that are not visible in images. For example, the machine learning module 206 may predict the location of an arm of a player as it moves into a position obscured by another part of the player.

In some embodiments, the machine learning module 206 may generate the machine learning model of the locations of body parts based on supervised learning. For example, the machine learning module 206 may use the training data to generate a machine learning model that determines the location of body parts and predicts the locations of body parts that are obscured in some of the images. A user may review the prediction and provide feedback that identifies instances where the prediction was incorrect. The machine learning module 206 may instruct the user interface module 212 to generate a user interface that allows the user to identify a location of the error. In some embodiments, the user interface allows the user to correct the error by identifying where the skeletal model should be places. For example, video frame 535 of FIG. 5C illustrates a skeletal model for the player that is inaccurate because it places the right-hand part 536 of the skeletal model on the players calf. In this example, the user interface may include an option for drawing the skeletal model to be in the center of the user's calf all the way to the shoe. As a result of receiving feedback from a user, the machine learning module 206 revises the machine learning model to be more accurate.

The machine learning module 206 may predict the location of body parts by predicting the location of the body parts based on a trajectory of movement detected in a series of video frames. For example, instead of predicting the location of a player's arm from a single frame, the machine learning module 206 may predict, from a series of video frames that show the player's right arm moving with a sweeping gesture, that the right arm will move in front of the player's body. In some embodiments, the machine learning module 206 may use the training data to determine an average number of frames that are needed for prediction of the movement of a player's body parts. Video frame 540 of FIG. 5C illustrates a skeletal model that predicts the location of the player's left foot even though it is obscured by the right foot.

In some embodiments, the machine learning module 206 may generate the machine learning model that predicts the locations of obscured body parts based on supervised learning. For example, video frame 545 illustrates a prediction that the center of the right arm ends 546 too low. In some embodiments the machine learning module 206 instructs the user interface to provide an option for correcting the skeletal model by providing feedback that places the skeletal model in the correct place. Continuing with the above example, the user interface may provide an option for the user to click and drag the skeletal model from the right arm end 546 to the center of the player's right shoulder. Video frame 550 provides another example where the skeletal model of the player's right side goes outside the player's body. In some embodiments, the machine learning module 206 may instruct the user interface to provide an option for a user to provide a prediction of the location of a body part obscured in the video frame. For example, video frame 555 of FIG. 5C could be marked by the user by providing a prediction of the skeletal model of the player's right arm, which is obscured by the player's torso.

The machine learning model may include a variety of model forms or structures, such as a neural-network (e.g., a linear network), a deep neural network that implements a plurality of layers (e.g., hidden layers between an input layer and an output layer, with each layer being a linear network), a convolutional neural network (e.g., a network that splits or partitions input data into multiple parts or tiles, processes each tile separately using one or more neural-network layers, and aggregates the results from the processing of each tile), a sequence-to-sequence neural network (e.g., a network that takes as input sequential data such as a series of locations of a vehicle, images of a parking lot, etc. and produces as output a result sequence), etc.

The machine learning model form or structure may specify connectivity between various nodes and an organization of nodes into layers. For example, nodes of a first layer (e.g., an input layer) may receive video data from the processing module 204. Subsequent intermediate layers may receive as input output of nodes of a previous layer per the connectivity specified in the machine learning model form or structure. These layers may also be referred to as hidden layers. A final layer (e.g., an output layer) produces an output of the machine learning model. For example, the output may be the machine learning model for tracking a location of body parts of a player and that is used to generate a simulation.

In some embodiments, the machine learning model may be refined through feedback. For example, the machine learning module 206 may receive an identification of a location of the skeletal model or a correction of the skeletal model. As a result of the feedback, the machine learning module 206 may generate a revised machine learning model that incorporates the feedback.

The tracking module 208 may include code and routines for identifying one or more players in the sporting event and identifying poses of the one or more players during the sporting event. In some embodiments, the tracking module 208 includes a set of instructions executable by the processor 225 to identify the one or more players in the sporting event and identify poses of the one or more players during the sporting event. In some embodiments, the tracking module 208 is stored in the memory 227 of the computing device 200 and is accessible and executable by the processor 225.

The tracking module 208 may use the machine learning model to track the location of a player in a new video processed by the processing module 204. In some embodiments, the tracking module 208 uses the machine learning model to generate a skeletal model of the player in one or more frames of the new video and to predict the location of body parts that are obscured in the one or more frames of the new video. Based on the skeletal model and the prediction of body parts, the tracking module identifies poses of each of the one or more players during the sporting event.

In some embodiments, the tracking module 208 may use a classifier to identify people in the event. This may apply to the players, to the players and other people that participate in the event, such as a referee or a coach, or to everyone who can be identified including spectators of the sporting event. The tracking module 208 may use the classifications to improve the identification of obscured body parts. For example, the tracking module 208 may determine that a player's arm is being obscured by a referee, which results in a different analysis than if the player's arm is obscured by the player's torso.

The simulation module 210 may include code and routines for using the machine learning model to generate a 3D model of the sporting event and a simulation of the 3D model. In some embodiments, the simulation module 210 includes a set of instructions executable by the processor 225 to generate the simulation. In some embodiments, the simulation module 210 is stored in the memory 227 of the computing device 200 and is accessible and executable by the processor 225.

In some embodiments, the simulation module 210 uses the machine learning model to generate the simulation. The simulation module 210 may use the boundaries of the sporting event as provided by the processing module 204 to generate boundaries for the simulation. The simulation module 210 may input the motion of the sporting object to the machine learning model to simulate the movement of the sporting object. The simulation module 210 may receive the poses of the one or more players from the tracking module 208 and generate a 3D model of the sporting event based on the poses of the one or more players. The simulation module 210 may use the boundaries, the movement of the sporting object, and the 3D model to generate the simulation of the 3D model.

The simulation module 210 may generate the simulation in substantially real time to correspond to a live sporting event. The simulation module 210 may add audio to the simulation that corresponds to audio from the sporting event. In some embodiments, the audio is processed by the processing module 204 and the simulation module 210 receives the audio from the simulation module 210.

In some embodiments, the simulation module 210 may perform segmentation of the sports event to recognize important events within the game. For example, the sporting event may be divided up into quarters for football, innings for baseball, etc. The simulation module 210 may use the machine learning model to identify the important events and/or receive manual identification of important events. For example, the machine learning model may identify important events based on a crowd's reaction to an action during the sporting event. In some embodiments, the simulation module 210 may instruct the user interface module 212 to identify important events for a user. For example, the user interface module 212 may include bookmarks to identify important events, such as the scoring of each goal in a soccer game.

The user interface module 212 may include code and routines for generating a user interface. In some embodiments, the interface module 212 includes a set of instructions executable by the processor 225 to generate the user interface. In some embodiments, the interface module 212 is stored in the memory 227 of the computing device 200 and is accessible and executable by the processor 225.

The user interface 212 may receive instructions from the simulation module 210 to generate graphical data for displaying the simulation of the 3D model of the sporting event. The simulation may be a substantially real-time representation of a live sporting event. The simulation is XR content. For example, the simulation may be AR that is overlaid on a broadcast of the sporting event or the simulation may be displayed in AR viewing goggles. In another example, the simulation may be VR that is viewable using a display device, such as an Oculus Rift® headset. In yet another example, the simulation may be MR that displays the simulation on a mobile device.

Figure 6A:
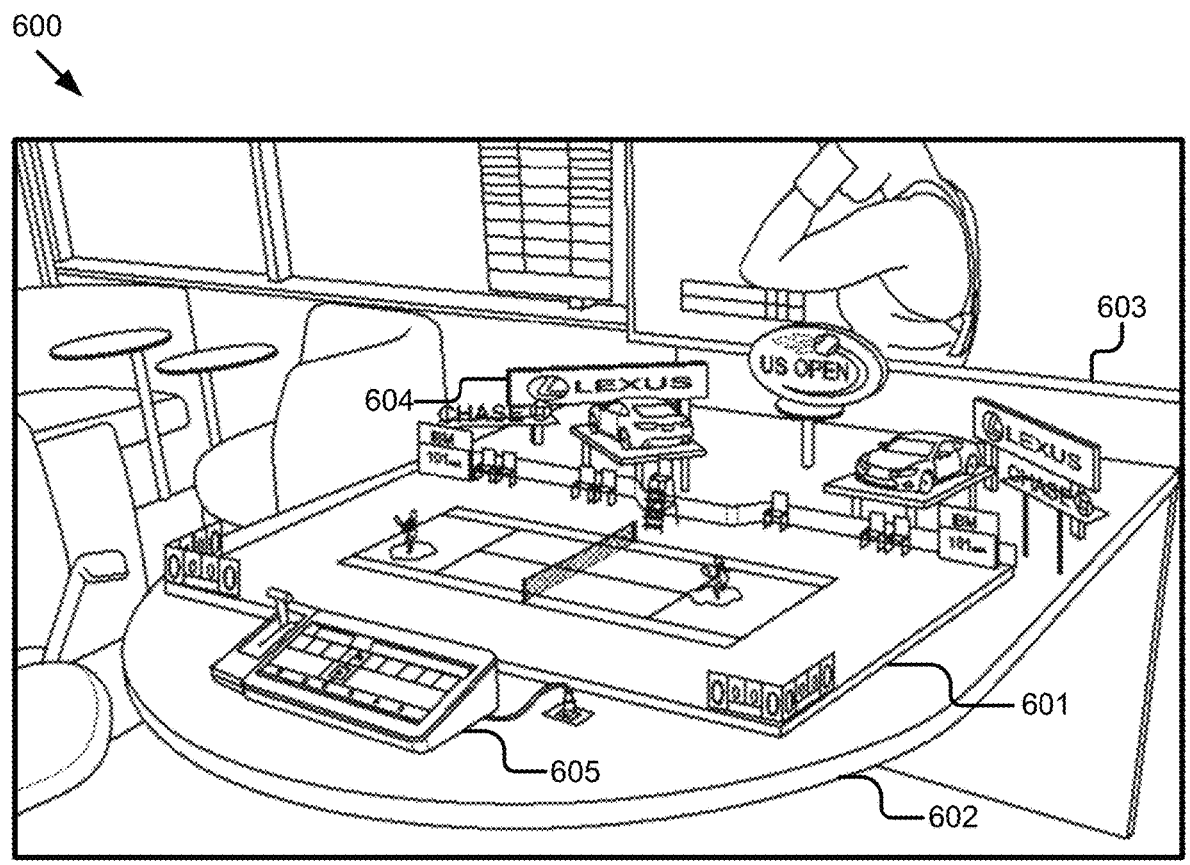
FIG. 6A illustrates a block diagram of an example of a simulation of a tennis match according to some embodiments.

FIG. 6A illustrates a block diagram 600 of an example of a simulation of a tennis match according to some embodiments. In this example, the simulation may be viewed by a user wearing AR goggles, where the simulation is overlaid on top of real-world content. For example, the simulation includes a 3D model of the tennis match 601 that is displayed on a real-world table 602 in front of a 2D screen 603 displaying the live version of the tennis match. The simulation additionally includes billboards 604 for advertising different companies, and a 3D model of user interface buttons 605.

The simulation may provide a monetization opportunity for advertisers to pay for their logo to be present within the 3D models. The simulation may be part of bonus content that a user may view after they have purchased viewing rights to view the sporting event.

In some embodiments, the user interface module 212 may associate user profiles from the social network with the identified people. For example, the user interface module 212 may generate graphical content for displaying the players where the players are linked to social network profiles. For example, a user may select one of the players (such as by using VR gloves, hovering a mouse of the player, etc.) to cause a link to be displayed that the user can select to view the corresponding social network profile for the player. In some embodiments, the user interface module 212 uses the classifiers generated by the tracking module 208 to identify one or more of a player, a referee, and a spectator in the audience. The user interface module 212 may provide a link for each identified person in the sporting event.

In some embodiments, the user interface module 212 may determine the capabilities of the user device 115 that will display the 3D content and selectively display content based on what the user device 115 is capable of displaying. For example, if the user device 115 is a smartphone, the 3D content has less content than if the user device 115 includes AR viewing goggles. In some embodiments, the user interface module 212 may add another video to the simulation, such as the 3D model described above. For example, the user interface module 212 may display a sporting event and include a 3D model of a commentator that describes the actions in the game. The commentator may be part of the simulation or displayed as a separate simulation that the user may toggle between.

In some embodiments, the user interface module 212 may determine an identity of the user and display advertisements that are personalized for the user. For example, if the user is interested in cars, the user interface module 212 may select a Lexus advertisement to include in the 3D content.

Figure 6B:
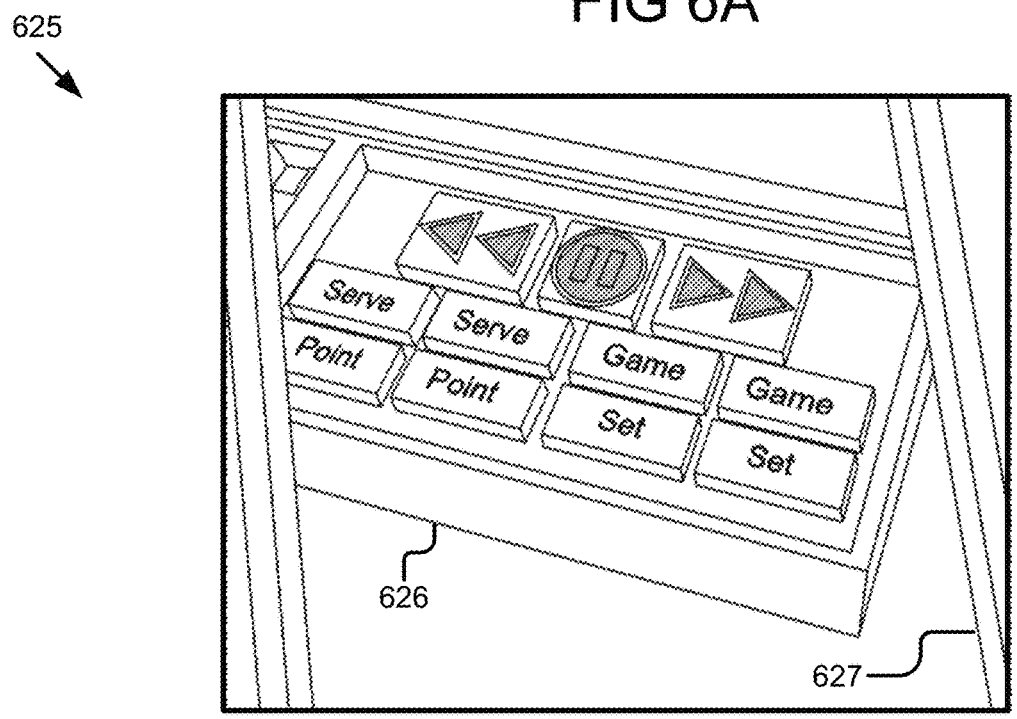
FIG. 6B illustrates a block diagram of an example user interface for modifying the simulation of a sporting event according to some embodiments.

FIG. 6B illustrates a block diagram 625 of an example user interface that for modifying the simulation of a sporting event according to some embodiments. In this example, the user interface 626 is displayed on a mobile device 627. As a user moves the mobile device 627, different parts of the simulation are displayed. For example, if the user wanted to view one of the tennis players illustrated in FIG. 6A, the user would move the mobile device 627 upwards.

The user interface 626 includes buttons for viewing the game, pausing the game, rewinding the game, fast forwarding the game, or choosing different points in the tennis game, such as a serve, a point, a game, and a set. The user interface module 212 may generate a user interface with different points depending on the type of game. For example, here the user interface buttons are configured for a tennis match, but they could be changed for other sporting events including soccer, football, basketball, lacrosse, baseball, etc. In some embodiments, the user interface 626 may include an option to bookmark parts of the sporting event for viewing later.

In some embodiments, the user interface module 212 may generate a user interface with an option for synchronized viewing where two different users can view the same sporting event on their respective user devices 115 at substantially the same time. In some embodiments, the user interface module 212 may include an option for the users to participate in the same viewing experience on their respective user devices 115 such that a first viewer could view a second viewer's selection of different user interface buttons and subsequent playback of particular events.

Example Method

Figure 7:
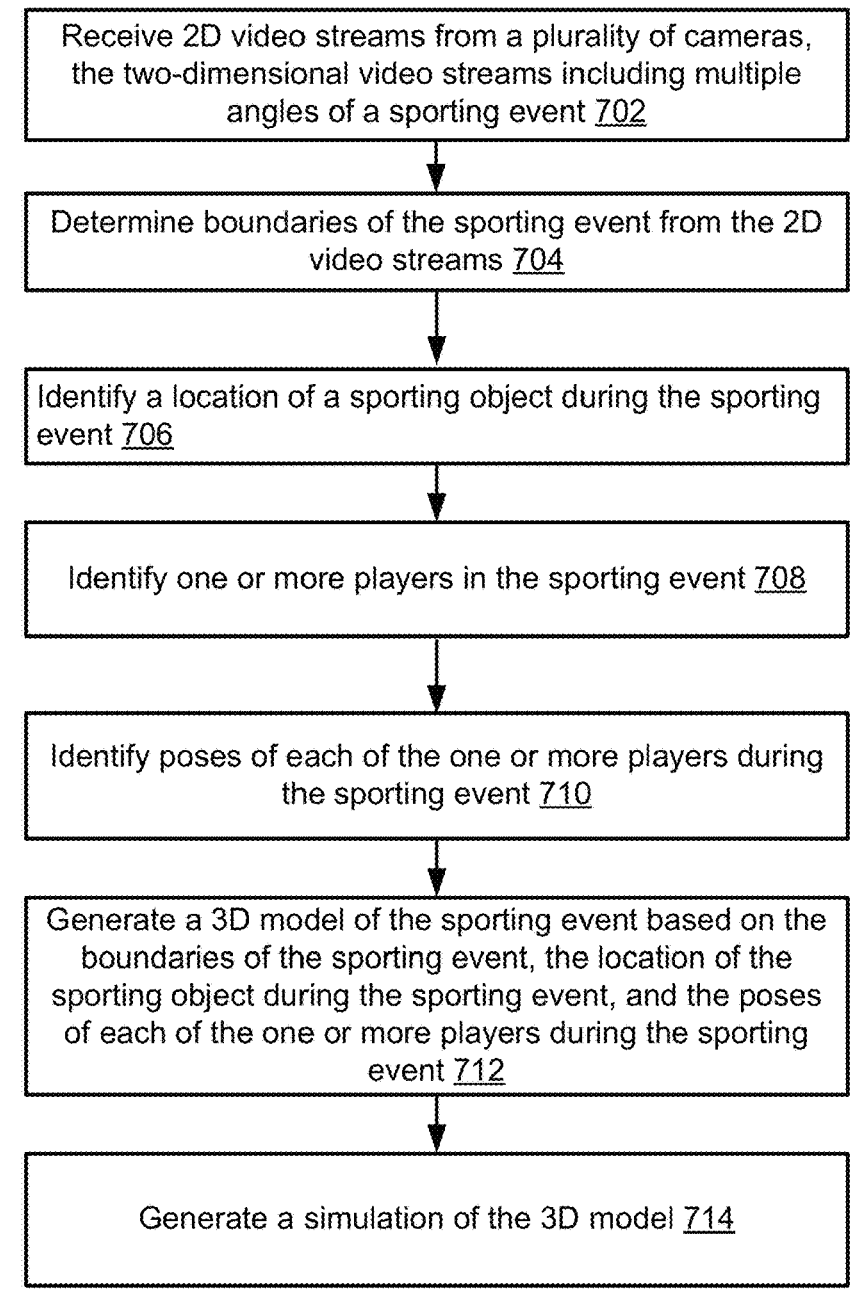
FIG. 7 illustrates an example flowchart for generating a simulation of the 3D model from 2D videos according to some embodiments.

FIG. 7 illustrates an example flowchart 700 for generating a simulation of the 3D model from 2D videos according to some embodiments. The steps in FIG. 7 may be performed by the XR application 103a stored on the XR server 101, the XR application 103b stored on the user device 115, or a combination of the XR application 103a stored on the XR server 101 and the XR application 103b stored on the user device 115.

At step 702, 2D video streams from a plurality of cameras 111 are received, where the two-dimensional video streams include multiple angles of a sporting event. For example, a tennis match may include 2D images from a birds-eye view and closer views of each player. At step 704, boundaries of the sporting event are determined from the two-dimensional video streams. For example, the XR application 103 determines the boundaries for a tennis court. At step 706, a location of a sporting object during the sporting event is determined. For example, the XR application 103 determines the location of the tennis ball in each frame of the video for the sporting event. The XR application 103 may determine the location of the ball for each 2D images that correspond to a particular camera 111.

At step 708, one or more players are identified in the sporting event. For example, for the tennis match the two players are identified. At step 710, a pose of each of the one or more players during the sporting event is identified. At step 712, a 3D model of the sporting event is generated based on the boundaries of the sporting event, the location of the sporting object during the sporting event, and the poses of each of the one or more players during the sporting event. At step 712, a simulation of the 3D model is generated.

The separation of various components and servers in the embodiments described herein should not be understood as requiring such separation in all embodiments, and it should be understood that the described components and servers may generally be integrated together in a single component or server. Additions, modifications, or omissions may be made to the illustrated embodiment without departing from the scope of the present disclosure, as will be appreciated in view of the disclosure.

Embodiments described herein contemplate various additions, modifications, and/or omissions to the above-described panoptic virtual presence system, which has been described by way of example only. Accordingly, the above-described camera system should not be construed as limiting. For example, the camera system described with respect to FIG. 1 below may include additional and/or different components or functionality than described above without departing from the scope of the disclosure.

Embodiments described herein may be implemented using computer-readable media for carrying or having computer-executable instructions or data structures stored thereon. Such computer-readable media may be any available media that may be accessed by a general purpose or special purpose computer. By way of example, and not limitation, such computer-readable media may include tangible computer-readable storage media including Random Access Memory (RAM), Read-Only Memory (ROM), Electrically Erasable Programmable Read-Only Memory (EEPROM), Compact Disc Read-Only Memory (CD-ROM) or other optical disk storage, magnetic disk storage or other magnetic storage devices, flash memory devices (e.g., solid state memory devices), or any other storage medium which may be used to carry or store desired program code in the form of computer-executable instructions or data structures and which may be accessed by a general purpose or special purpose computer. Combinations of the above may also be included within the scope of computer-readable media.

Computer-executable instructions comprise, for example, instructions and data which cause a general purpose computer, special purpose computer, or special purpose processing device (e.g., one or more processors) to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the terms "module" or "component" may refer to specific hardware embodiments configured to perform the operations of the module or component and/or software objects or software routines that may be stored on and/or executed by general purpose hardware (e.g., computer-readable media, processing devices, etc.) of the computing system. In some embodiments, the different components, modules, engines, and services described herein may be implemented as objects or processes that execute on the computing system (e.g., as separate threads). While some of the system and methods described herein are generally described as being implemented in software (stored on and/or executed by general purpose hardware), specific hardware embodiments or a combination of software and specific hardware embodiments are also possible and contemplated. In this description, a "computing entity" may be any computing system as previously defined herein, or any module or combination of modulates running on a computing system.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the inventions have been described in detail, it may be understood that the various changes, substitutions, and alterations could be made hereto without departing from the spirit and scope of the invention.

What is claimed is:

1. A method comprising:
receiving two-dimensional video streams from a plurality of cameras, the two-dimensional video streams including multiple angles of a live event;
determining boundaries of the live event from the two-dimensional video streams;
identifying a location of a live object during the live event;
identifying one or more players in the live event;
identifying poses of each of the one or more players during the live event;
identifying one or more social network profiles that correspond to the one or more players in the live event;
generating a three-dimensional model of the live event based on the boundaries of the live event, the location of the live object during the live event, and the poses of each of the one or more players during the live event;
generating a simulation of the three-dimensional model;
providing a presentation of the simulation of the three-dimensional model as an augmentation of real-world content in a cross-reality view presented to a user, the real-world content including a presentation of the live event that is different from the presentation of the simulation of the three-dimensional model in the cross-reality view; and providing, together with the presentation of the simulation of the three-dimensional model and as an additional augmentation of the real-world content in the cross-reality view presented to the user, a presentation of one or more links to the one or more social network profiles of the one or more players and a presentation of an additional three-dimensional model, the additional three-dimensional model being of buttons for controlling the presentation of the simulation.

2. The method of claim 1, further comprising:
providing the simulation to a cross reality system that includes augmented reality glasses, wherein the simulation is overlaid onto real-world elements included in the real-world content.

3. The method of claim 1, further comprising:
generating a machine learning model, wherein the machine learning model is used to determine the boundaries, identify the location of the live event, identify the poses of each of the one or more players, generate the three-dimensional model, and generate the simulation.

4. The method of claim 3, wherein the machine learning model is generated by at least one of a deep neural network, a convolutional neural network, and a recurrent neural network.

5. The method of claim 1, wherein identifying the poses of the one or more players during the live event includes generating a skeletal model of each of the one or more players and the skeletal model predicts a location of corresponding body parts that are obscured in image frames of the two-dimensional video streams.

6. The method of claim 5, further comprising:
classifying people that are in the two-dimensional video streams including the one or more players;
wherein predicting the location of corresponding body parts that are obscured in the image frames includes applying a classification of the people to determine whether the corresponding body parts are obscured by the one or more players or an other person.

7. The method of claim 6, further comprising:
identifying one or more additional social network profiles that correspond to additional people that are in the two-dimensional video streams, wherein the additional people include spectators to the live event; and
providing one or more additional links to the one or more additional social network profiles within the simulation.

8. The method of claim 1, further comprising generating the additional three-dimensional model of buttons based on a type of the live event.

9. The method of claim 8, wherein the additional three-dimensional model includes at least one button that is specific to the type of the live event and that is for selecting an event in the live event for playback in the presentation of the simulation.

10. The method of claim 1, wherein the simulation of the three-dimensional model and the additional three-dimensional model are presented in a user interface that includes an option to create a bookmark of part of the live event for later viewing.

11. A system comprising:
one or more processors coupled to a memory;
a processing module stored in the memory and executable by the one or more processors, the processing module operable to receive two-dimensional video streams from a plurality of cameras, the two-dimensional video streams including multiple angles of a live event;
a machine learning module stored in the memory and executable by the one or more processors, the machine learning module operable to generate a machine learning model to determine boundaries of the live event from the two-dimensional video streams and identify a location of a live object during the live event;
a tracking module stored in the memory and executable by the one or more processors, the tracking module operable to, based on the machine learning model, identify one or more players in the live event, identify one or more social network profiles that correspond to the one or more players in the live event, and identify poses of each of the one or more players during the live event;
a simulation module stored in the memory and executable by the one or more processors, the simulation module operable to, based on the machine learning model, generate a three-dimensional model of the live event based on the boundaries of the live event, the location of the live object during the live event, and the poses of each of the one or more players during the live event and generate a simulation of the three-dimensional model; and
a user interface module stored in memory and executable by the one or more processors, the user interface module operable to provide a presentation of the simulation of the three-dimensional model as an augmentation of real-world content in a cross-reality view presented to a user, the real-world content including a presentation of the live event that is different from the presentation of the simulation of the three-dimensional model in the cross-reality view;
wherein the user interface module is operable to provide, together with the presentation of the simulation of the three-dimensional model and as an additional augmentation of the real-world content in the cross-reality view presented to the user, a presentation of one or more links to the one or more social network profiles of the one or more players and a presentation of an additional three-dimensional model, the additional three-dimensional model being of buttons for controlling the presentation of the simulation.

12. The system of claim 11, wherein the simulation of the three-dimensional model and the additional three-dimensional model are overlaid onto real-world elements included in the real-world content.

13. The system of claim 12, wherein the machine learning model is generated by at least one of a deep neural network, a convolutional neural network, and a recurrent neural network.

14. The system of claim 11, wherein identifying the poses of the one or more players during the live event includes generating a skeletal model of each of the one or more players and the skeletal model predicts a location of corresponding body parts that are obscured in image frames of the two-dimensional video streams.

15. A non-transitory computer storage medium encoded with instructions that, when executed by one or more processors, cause the one or more processors to perform operations comprising:

receiving two-dimensional video streams from a plurality of cameras, the two-dimensional video streams including multiple angles of a live event;

determining boundaries of the live event from the two-dimensional video streams;

identifying a location of a live object during the live event;

identifying one or more players in the live event;

identifying poses of each of the one or more players during the live event;

identifying the one or more social network profiles that correspond to the one or more players in the live event;

generating a three-dimensional model of the live event based on the boundaries of the live event, the location of the live object during the live event, and the poses of each of the one or more players during the live event;

generating a simulation of the three-dimensional model;

providing a presentation of the simulation of the three-dimensional model as an augmentation of real-world content in a cross-reality view presented to a user, the real-world content including a presentation of the live event that is different from the presentation of the simulation of the three-dimensional model in the cross-reality view; and providing, together with the presentation of the simulation of the three-dimensional model and as an additional augmentation of the real-world content in the cross-reality view presented to the user, a presentation of one or more links to the one or more social network profiles of the one or more players and a presentation of an additional three-dimensional model, the additional three-dimensional model being of buttons for controlling the presentation of the simulation.

16. The non-transitory computer storage medium of claim 15, wherein the operations further comprise:

providing the simulation to a cross reality system that includes augmented reality glasses by way of which the simulation is overlaid onto real-world elements included in the real-world content.

17. The non-transitory computer storage medium of claim 15, wherein the operations further comprise:

generating a machine learning model, wherein the machine learning model is used to determine the boundaries, identify the location of the live event, identify the poses of each of the one or more players, generate the three-dimensional model, and generate the simulation.

18. The non-transitory computer storage medium of claim 17, wherein the machine learning model is generated by at least one of a deep neural network, a convolutional neural network, and a recurrent neural network.

19. The non-transitory computer storage medium of claim 15, wherein identifying the poses of the one or more players during the live event includes generating a skeletal model of each of the one or more players and the skeletal model predicts a location of corresponding body parts that are obscured in image frames of the two-dimensional video streams.

* * * * *